US012765082B2

(12) United States Patent
Tomita et al.

(10) Patent No.: US 12,765,082 B2
(45) Date of Patent: Oct. 13, 2026

(54) SOLID-STATE IMAGING DEVICE AND METHOD OF MANUFACTURING SOLID-STATE IMAGING DEVICE

(71) Applicant: SONY SEMICONDUCTOR SOLUTIONS CORPORATION, Kanagawa (JP)

(72) Inventors: Chihiro Tomita, Kanagawa (JP); Koichiro Zaitsu, Kanagawa (JP); Hidenobu Tsugawa, Kanagawa (JP); Junpei Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 385 days.

(21) Appl. No.: 18/550,732

(22) PCT Filed: Jan. 11, 2022

(86) PCT No.: PCT/JP2022/000527
§ 371 (c)(1),
(2) Date: Sep. 15, 2023

(87) PCT Pub. No.: WO2022/201745
PCT Pub. Date: Sep. 29, 2022

(65) Prior Publication Data

US 2024/0162265 A1 May 16, 2024

(30) Foreign Application Priority Data

Mar. 25, 2021 (JP) ................................ 2021-051844

(51) Int. Cl.
*H01L 27/146* (2006.01)
*H10F 39/00* (2025.01)
(Continued)

(52) U.S. Cl.
CPC ......... *H10F 39/026* (2025.01); *H10F 39/184* (2025.01); *H10F 39/807* (2025.01);
(Continued)

(58) Field of Classification Search
CPC .... H10F 39/026; H10F 39/184; H10F 39/807; H10F 39/809; H10F 39/811
See application file for complete search history.

(56) References Cited

U.S. PATENT DOCUMENTS 7,915,069 B2 * 3/2011 Inoue .................. H10F 39/1865 257/292
9,159,764 B2 * 10/2015 Yoshihara ............. H10F 39/182
(Continued)

FOREIGN PATENT DOCUMENTS

JP 2011-114325 6/2011
JP 2012-033894 2/2012
(Continued)

OTHER PUBLICATIONS

International Search Report and Written Opinion prepared by the Japan Patent Office on Feb. 28, 2022, for International Application No. PCT/JP2022/000527, 2 pgs.

*Primary Examiner* — Thao P Le
(74) *Attorney, Agent, or Firm* — SHERIDAN ROSS P.C.

(57) ABSTRACT

A solid-state imaging device includes a first semiconductor layer, a second semiconductor layer, and an external terminal. The first semiconductor layer has a pixel region in which a plurality of pixels is arranged, and a peripheral region provided around the pixel region. The second semiconductor layer is stacked on the first semiconductor layer, and is provided with a pixel circuit coupled to the pixels. The external terminal is provided in an opening that communicates with the second semiconductor layer from the peripheral region in the first semiconductor layer. A first isolator is provided in the first semiconductor layer within the periph-
(Continued)

eral region, and surrounds at least a portion of an outer periphery of the opening. A second isolator is provided in the second semiconductor layer within a region corresponding to the peripheral region, and surrounds at least a portion of the outer periphery of the opening.

18 Claims, 30 Drawing Sheets

(51) Int. Cl.
*H10F 39/18* (2025.01)
*H10W 42/00* (2026.01)

(52) U.S. Cl.
CPC ......... *H10F 39/809* (2025.01); *H10F 39/811* (2025.01); *H10W 42/121* (2026.01)

(56) References Cited

U.S. PATENT DOCUMENTS

| | | | | |
|---|---|---|---|---|
| 12,183,757 | B2 * | 12/2024 | Kitano | H04N 25/79 |
| 2011/0127629 | A1 * | 6/2011 | Yorikado | H10F 39/014 257/E31.127 |
| 2012/0275480 | A1 | 11/2012 | Koike et al. | |
| 2013/0105667 | A1 | 5/2013 | Kobayashi | |
| 2020/0343280 | A1 | 10/2020 | Ishino | |
| 2023/0395642 | A1 * | 12/2023 | Kawamura | H10F 39/18 |
| 2024/0162265 | A1 * | 5/2024 | Tomita | H10F 39/026 |
| 2025/0150724 | A1 * | 5/2025 | Ogino | H04N 25/131 |
| 2025/0176303 | A1 * | 5/2025 | Tanaka | H10F 39/809 |

FOREIGN PATENT DOCUMENTS

| | | | |
|---|---|---|---|
| JP | 2012-231027 | | 11/2012 |
| JP | 2020-181953 | | 11/2020 |
| KR | 20110060802 | A | 6/2011 |
| KR | 20120121342 | A | 11/2012 |
| KR | 20190054769 | A | 5/2019 |
| WO | WO-2012117931 | A1 | 9/2012 |
| WO | WO 2020/262643 | | 12/2020 |

* cited by examiner

SOLID-STATE IMAGING DEVICE AND METHOD OF MANUFACTURING SOLID-STATE IMAGING DEVICE

CROSS REFERENCE TO RELATED APPLICATIONS

This application is a national stage application under 35 U.S.C. 371 and claims the benefit of PCT Application No. PCT/JP2022/000527, having an international filing date of 11 Jan. 2022, which designated the United States, which PCT application claimed the benefit of Japanese Patent Application No. 2021-051844, filed 25 Mar. 2021, the entire disclosures of each of which are incorporated herein by reference.

TECHNICAL FIELD

The present disclosure relates to a solid-state imaging device and a method of manufacturing a solid-state imaging device.

BACKGROUND ART

PTL 1 discloses a solid-state imaging device as a semiconductor device. The solid-state imaging device is formed to have a composite chip structure in which a first part and a second part are joined to each other. The first part is formed with semiconductor elements such as transistors. The second part is formed with a plurality of imaging elements provided in a two-dimensional array format. Around each of the plurality of imaging elements provided on the second part, an opening penetrating through a semiconductor layer is formed. In the opening, an external coupling electrode is provided. Around the opening in the semiconductor layer, an insulating structure body is further formed through deep trench isolation. Even if a wire coupled to the external coupling electrode comes into contact with an inner wall of the opening, the insulating body structure secures an insulating state with respect to the elements formed in the semiconductor layer. It is therefore possible to prevent a leak phenomenon. In addition, mechanical strength of the semiconductor layer is enhanced by the insulating structure body, which makes it possible to reduce cracks caused by bonding of wires. Furthermore, it is possible to suppress chipping at chip ends caused by dicing.

CITATION LIST

Patent Literature

PTL 1: Japanese Unexamined Patent Application Publication No. 2020-181953

SUMMARY OF THE INVENTION

In a method of manufacturing a solid-state imaging device described above, a step of forming a trench, a step of forming an insulating film in the trench, and other steps are separately added to form an insulating structure body around an external coupling electrode. Measures have therefore been demanded to solve those including an increased number of steps in manufacturing a solid-state imaging device and a complicated structure of the insulating structure body.

The present disclosure provides a solid-state imaging device that makes it possible to easily achieve a structure of an insulating structure body provided around an external terminal, and a method of manufacturing a solid-state imaging device, which makes it possible to reduce the number of steps in manufacturing an insulating structure body.

A solid-state imaging device according to a first embodiment of the present disclosure includes: a first semiconductor layer having a pixel region and a peripheral region, the pixel region in which a plurality of pixels is arranged, and the peripheral region provided around the pixel region; a second semiconductor layer stacked on the first semiconductor layer on side opposite to light incident side of the pixels, the second semiconductor layer being provided with a pixel circuit coupled to the pixels; an external terminal provided in an opening that communicates with the second semiconductor layer from the peripheral region in the first semiconductor layer; a first isolator provided in the first semiconductor layer within the peripheral region, the first isolator surrounding at least a portion of an outer periphery of the opening; and a second isolator provided in the second semiconductor layer within a region corresponding to the peripheral region, the second isolator surrounding at least a portion of the outer periphery of the opening.

A method of manufacturing a solid-state imaging device, according to a second embodiment of the present disclosure includes: forming a pixel isolator in a pixel region of a first semiconductor layer, and forming a first isolator, the pixel isolator that isolates a plurality of pixels from each other, and the first isolator that surrounds at least a portion of an outer periphery of an opening that communicates with an external terminal provided within a peripheral region around the pixel region; forming a second semiconductor layer on the first semiconductor layer on side opposite to light incident side of the pixels, the second semiconductor layer being provided with a pixel circuit coupled to the pixels; and forming a circuit isolator in the pixel circuit, and forming a second isolator in the second semiconductor layer within the peripheral region, the circuit isolator penetrating through the second semiconductor layer in a thickness direction, and the second isolator surrounding at least a portion of the outer periphery of the opening.

MODES FOR CARRYING OUT THE INVENTION

Figure 1:
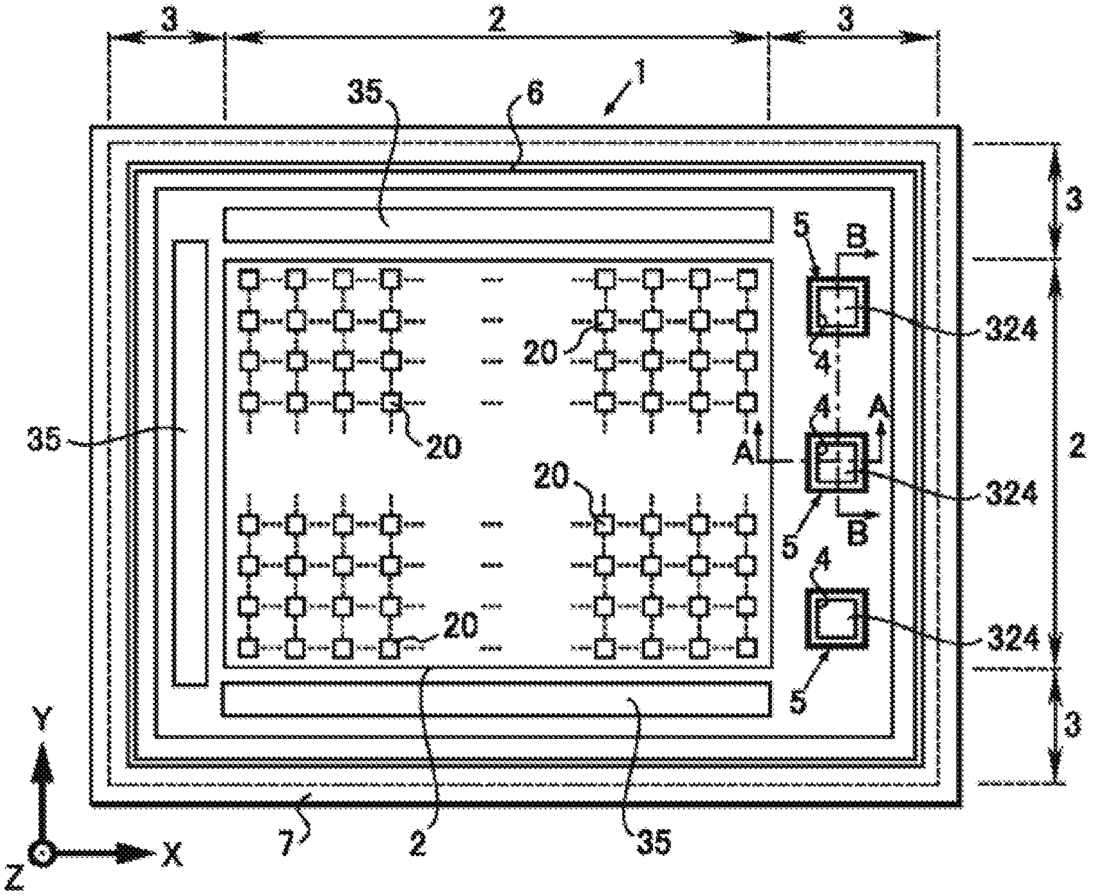
FIG. 1 is a schematic plan view of a solid-state imaging device according to a first embodiment of the present disclosure.

Embodiments of the present disclosure will now be described herein in detail with reference to the accompanying drawings. It is to be noted that description is given in the following order.

1. First Embodiment

A first embodiment describes an example in which the present technology is applied to a solid-state imaging device and a method of manufacturing a solid-state imaging device.

2. Second Embodiment

A second embodiment describes an example in which a planar shape of an isolator is changed in the solid-state imaging device according to the first embodiment.

3. Third Embodiment

A third embodiment describes an example in which a cross-sectional structure and the planar shape of the isolator are changed in the solid-state imaging device according to the first embodiment.

4. Fourth Embodiment

A fourth embodiment describes an example in which the cross-sectional structure and the planar shape of the isolator are changed in the solid-state imaging device according to the first embodiment.

5. Fifth Embodiment

A fifth embodiment describes an example in which the cross-sectional structure and the planar shape of the isolator are changed in the solid-state imaging device according to the first embodiment.

6. Sixth Embodiment

A sixth embodiment describes an example in which the cross-sectional structure and the planar shape of the isolator are changed in the solid-state imaging device according to the first embodiment.

7. Seventh Embodiment

A seventh embodiment describes an example in which the cross-sectional structure and the planar shape of the isolator are changed in the solid-state imaging device according to the first embodiment.

8. Application Example to Mobile Body

It describes an example in which the present technology is applied to a vehicle control system that is an example of a mobile body control system.

9. Application Example to Endoscopic Surgery System

It describes an example in which the present technology is applied to an endoscopic surgery system.

10. Other Embodiments

Note herein that an arrow X direction appropriately illustrated in the drawings indicates one direction on a plan of a solid-state imaging device 1 mounted on a flat surface for purpose of convenience. An arrow Y direction indicates another direction on the plan, which is orthogonal to the arrow X direction. Furthermore, an arrow Z direction indicates an upward direction that is orthogonal to the arrow X direction and the arrow Y direction. That is, the arrow X direction, the arrow Y direction, and the arrow Z direction respectively exactly coincide with an X-axis direction, a Y-axis direction, and a Z-axis direction in a three-dimensional coordinate system. Note that these directions are illustrated for helping understand the description, and are not intended to limit the directions used for the present technology.

1. First Embodiment

With reference to FIGS. 1 to 22, the solid-state imaging device 1 according to the first embodiment of the present disclosure and a method of manufacturing the solid-state imaging device 1 will now be described herein.

[Configuration of Solid-state Imaging Device 1]

(1) Plan Layout Configuration of Solid-State Imaging Device 1

FIG. 1 illustrates a schematic plan configuration example of the solid-state imaging device 1 according to the first embodiment of the present disclosure. As illustrated in FIG. 1, the solid-state imaging device 1 has a pixel region 2 and a peripheral region 3. The solid-state imaging device 1 is formed into a rectangular planar shape, as viewed in the arrow Z direction (hereinafter simply referred to as "as viewed in a plan view"). The pixel region 2 is provided at a middle portion on a surface on light incident side of the solid-state imaging device 1. Within the pixel region 2, a plurality of pixels 20 that convert incident light into electric signals is arranged in a matrix.

The peripheral region 3 is provided on the surface of the solid-state imaging device 1 at a peripheral portion that is outside the pixel region 2. Within the peripheral region 3, coupling regions 35 are provided at positions on upper side of the sheet, lower side of the sheet, and left side of the sheet with respect to the pixel region 2. On side opposite to the light incident side of the solid-state imaging device 1, a third base body 300 is joined (see FIG. 3). A peripheral circuit is provided in the third base body 300. The coupling regions 35 are provided to serve as portions for coupling the pixel region 2 and the peripheral circuit to each other.

Within the peripheral region 3, external terminals (bonding pads) 324 are provided at positions on right side of the sheet with respect to the pixel region 2. Three external terminals 324 are herein provided at equal intervals in the arrow Y direction, and aligned in a single column in the arrow X direction. A surface of each of the external terminals 324 is exposed within an opening (bonding opening) 4 that is formed by digging down a semiconductor layer, an insulating layer, and the like in a thickness direction. The external terminals 324 are each configured to be electrically coupled to a wire 8 (see FIG. 4). In at least a portion of an outer periphery of a side surface of the opening 4, an isolator 5 that constitutes an insulating structure body (pad peripheral guard ring) is provided to surround the opening 4. A detailed structure of the isolator 5 will be described later.

A guard ring (chip peripheral guard ring) 6 is provided in an outermost periphery of the peripheral region 3 in the solid-state imaging device 1. Furthermore, a dicing region 7 is provided outside the guard ring 6.

(2) Circuit Configuration of Pixel 20 and Pixel Circuit 24

Figure 2:
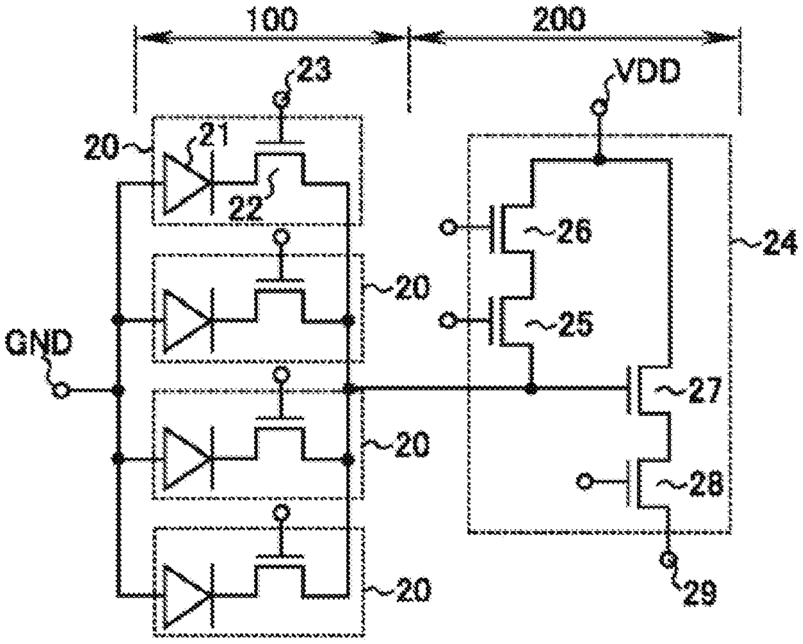
FIG. 2 is a circuit diagram illustrating a configuration of pixels and a pixel circuit in the solid-state imaging device illustrated in FIG. 1.

As illustrated in FIG. 2, one pixel 20 includes a series circuit including a photodiode 21 and a transfer transistor 22. An anode terminal of the photodiode 21 is coupled to a reference potential GND. A cathode terminal of the photodiode 21 is coupled to one terminal of the transfer transistor 22. The photodiode 21 converts light that is incident from outside the solid-state imaging device 1 into an electric signal. Another terminal of the transfer transistor 22 is coupled to a pixel circuit 24. A control terminal of the transfer transistor 22 is coupled to a horizontal signal line 23.

The pixel circuit 24 includes a floating diffusion (FD) conversion gain switching transistor 25, a reset transistor 26, an amplification transistor 27, and a selection transistor 28. The other terminal of the transfer transistor 22 is coupled to one terminal of the FD conversion gain switching transistor 25 and a control terminal of the amplification transistor 27. Another terminal of the FD conversion gain switching transistor 25 is coupled to one terminal of the reset transistor 26. Another terminal of the reset transistor 26 is coupled to a power supply potential VDD. One terminal of the amplification transistor 27 is coupled to one terminal of the selection transistor 28. Another terminal of the amplification transistor 27 is coupled to the power supply potential VDD. Another terminal of the selection transistor 28 is coupled to a vertical signal line 29.

(3) Structure in Pixel Region 2

Figure 3:
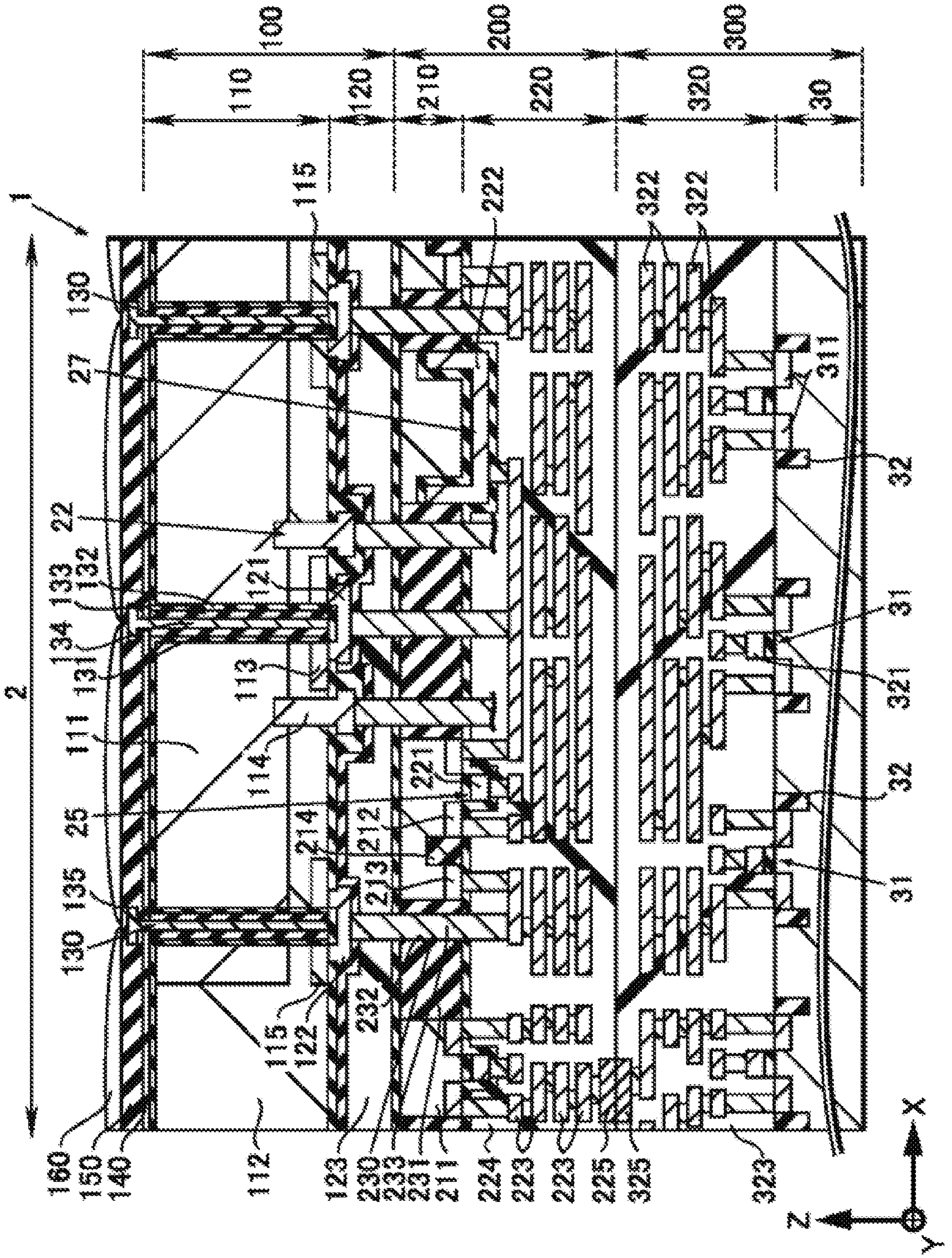
FIG. 3 is a longitudinal cross-sectional configuration diagram of a pixel region in the solid-state imaging device illustrated in FIG. 1.

As illustrated in FIG. 3, the solid-state imaging device 1 includes a first base body 100, a second base body 200, and the third base body 300 that are stacked. The first base body 100 is stacked on and joined to the second base body 200. The second base body 200 is stacked on and joined to the third base body 300.

The first base body 100 includes a first semiconductor layer 110 and a first wiring layer 120 provided on the second base body 200 side of the first semiconductor layer 110. The first semiconductor layer 110 includes single crystal silicon (Si).

Within the pixel region 2, the pixel 20 is formed in the first semiconductor layer 110. The photodiode 21 in the pixel 20 has an n-type semiconductor region 111 and a p-type semiconductor region 112. The n-type semiconductor region 111 is provided on light incident side of the first semiconductor layer 110, and serves as the cathode terminal. The p-type semiconductor region 112 is provided on the second base body 200 side of the first semiconductor layer 110, and serves as the anode terminal. The p-type semiconductor region 112 is configured as a p-type well region. The transfer transistor 22 in the pixel 20 has the n-type semiconductor region 111, an n-type semiconductor region 113, and an electrode 114. The n-type semiconductor region 111 is shared by the cathode terminal of the photodiode 21, and is configured as the one terminal of the transfer transistor 22. The n-type semiconductor region 113 is provided on the second base body 200 side of the p-type semiconductor region 112, and is configured as the other terminal of the transfer transistor 22. The electrode 114 is formed to penetrate through the p-type semiconductor region 112 from a surface portion on the second base body 200 side of the p-type semiconductor region 112 and reach the n-type semiconductor region 111. The electrode 114 is configured as the control terminal of the transfer transistor 22. The electrode 114 includes polycrystalline silicon, for example.

Furthermore, in the surface portion on the second base body 200 side of the p-type semiconductor region 112, a p-type semiconductor region 115 that is higher in impurity density and shallower in depth than the p-type semiconductor region 112 is provided. The p-type semiconductor region 115 is used as a well contact region, and supplies the reference potential GND.

Within the pixel region 2, a pixel isolation region 130 that electrically and optically isolates the pixels 20 from each other is provided between the pixels 20 in the first semiconductor layer 110. Although not illustrated, the pixel isolation region 130 is formed in a grid, as viewed in a plan view. The pixel isolation region 130 herein includes a trench 131, a pinning region 132, an insulating film 133, and a light shielding film 134.

The trench 131 is formed to penetrate through the first semiconductor layer 110, from the light incident side to the second base body 200 side in the thickness direction. That is, the pixel isolation region 130 is formed to have a full trench isolation structure. Note that the trench 131 may be formed to have a deep trench isolation structure that does not penetrate through the first semiconductor layer 110. The pinning region 132 is formed along an inner wall of the trench 131. The pinning region 132 includes an insulating material holding negative fixed electric charge and is able to suppress occurrence of a dark current. For example, the pinning region 132 includes hafnium oxide (HfO), zirconium oxide (ZrO), aluminum oxide (AlO), titanium oxide (TiO), or tantalum oxide (TaO). The insulating film 133 is formed along the inner wall of the trench 131 with the pinning region 132 interposed therebetween. The insulating film 133 includes silicon oxide (SiO), for example. The light shielding film 134 is buried in the trench 131 with the insulating films 133 interposed therebetween. The light shielding film 134 includes tungsten (W) or polycrystalline silicon, for example.

The first wiring layer 120 includes the electrode 114 described above, a first electrode terminal 121, a second electrode terminal 122, and an insulating layer 123. The first electrode terminal 121 is provided, below the pixel isolation region 130, on the second base body 200 side of the first semiconductor layer 110. The first electrode terminal 121 is coupled to the n-type semiconductor region 113 in the transfer transistor 22. The first electrode terminal 121 includes polycrystalline silicon, for example. The second electrode terminal 122 is provided, below the pixel isolation region 130, on the second base body 200 side of the first semiconductor layer 110. The second electrode terminal 122 is coupled to the p-type semiconductor region 115. The second electrode terminal 122 is formed in the same electrically-conductive layer as that where the first electrode terminal 121 is formed, and includes the same electrically-conductive material as the first electrode terminal 121. The insulating layer 123 is formed by stacking, for example, a silicon oxide film and a silicon nitride (SiN) film.

The second base body 200 includes a second semiconductor layer 210 joined to the first wiring layer 120 in the first base body 100 and a second wiring layer 220 provided on the third base body 300 side of the second semiconductor layer 210. The second semiconductor layer 210 includes single crystal silicon.

Within the pixel region 2, the pixel circuit 24 is formed in the second semiconductor layer 210. FIG. 3 illustrates the FD conversion gain switching transistor 25 and the amplification transistor 27 in the pixel circuit 24. The reset transistor 26 and the selection transistor 28 are not illustrated. The second semiconductor layer 210 has a p-type semiconductor region 211. The p-type semiconductor region 211 is configured to serve as a well region. The FD conversion gain switching transistor 25 includes a pair of n-type semiconductor regions 212 and an electrode 221. The n-type semiconductor regions 212 are provided in a surface portion on the third base body 300 side of each of the p-type semiconductor region 211, and are configured to serve as the one terminal and the other terminal. The electrode 221 is provided on a surface on the third base body 300 side of the p-type semiconductor regions 211, and is configured to serve as a control terminal. The electrode 221 includes polycrystalline silicon, for example. The amplification transistor 27 includes a pair of n-type semiconductor regions that are not illustrated, and an electrode 222. The n-type semiconductor regions are provided in the surface portion of the p-type semiconductor regions 211 similarly to the n-type semiconductor regions 212, and are configured to serve as the one terminal and the other terminal. The electrode 222 has a portion in the same electrically-conductive layer as that where the electrode 221 is formed, and is configured to serve as the control terminal.

Furthermore, a p-type semiconductor region 213 is provided in a surface portion on the third base body 300 side of the second semiconductor layer 210. The p-type semiconductor region 213 is used as a well contact region, similarly to the p-type semiconductor region 115.

Furthermore, between the n-type semiconductor region 212 and the p-type semiconductor region 213, an element isolator 214 is provided in the surface portion of the second semiconductor layer 210. Although any symbols are omitted, the element isolator 214 includes a trench formed from a surface on the third base body 300 side of the p-type semiconductor region 211 toward the first base body 100 side, and an insulating body buried in the trench.

The second wiring layer 220 includes the electrode 221 and the electrode 222 described above, wires 223 in a plurality of layers, and an insulating layer 224. The wires 223 are provided on a surface on the third base body 300 side of the second semiconductor layer 210. Although the number of wiring layers is not limited, the wires 223 here are provided in four layers. The wires 223 in the respective wiring layers are coupled to each other using plug wires, for which symbols are omitted. The insulating layer 224 is formed by stacking, for example, a silicon oxide film and a silicon nitride film.

At a position corresponding to the pixel isolation region 130, a full trench areas 230 is provided in the second semiconductor layer 210. The full trench area 230 includes an insulating body 231, a through hole (via hole) 232, and a through wire 233. The full trench area 230 constitutes a circuit isolator that electrically isolates elements in the pixel circuit 24 from each other. The insulating body 231 is provided in the second semiconductor layer 210 in a region where semiconductor elements such as the FD conversion gain switching transistor 25 are not provided. The insulating body 231 is formed in a whole region in the thickness direction of the second semiconductor layer 210. The through hole 232 is formed to penetrate through the insulating body 231 in the thickness direction. The through wire 233 is provided in the through hole 232. A side on the first base body 100 side of the through wire 233 reaches the first electrode terminal 121 in the first wiring layer 120, and is coupled to the first electrode terminal 121. A side on the third base body 300 side of the through wire 233 is coupled to the wire 223 closest to the second semiconductor layer 210. The through wire 233 includes tungsten, for example. Furthermore, a side on the first base body 100 side of another through wire 233 reaches the second electrode terminal 122 in the first wiring layer 120, and is coupled to the second electrode terminal 122.

A terminal 225 is provided on the third base body 300 side of the second wiring layer 220. The terminal 225 is mechanically joined to a terminal 325 in the third base body 300, and is electrically coupled to the terminal 325. The terminal 225 includes copper (Cu), for example.

The third base body 300 includes a substrate 30, and a third wiring layer 320 provided on the second base body 200 side of the substrate 30. As the substrate 30, a single crystal silicon substrate is used. In a surface portion on the second base body 200 side of the substrate 30, a transistor 31 that constitutes a peripheral circuit are provided. Although not described in detail, the peripheral circuit includes an input portion, a timing controller, a row driver, a column signal processor, an image signal processor, and an output portion, for example.

The transistor 31 includes a pair of n-type semiconductor regions 311 and an electrode 321. The pair of n-type semiconductor regions 311 is provided in the surface portion of the substrate 30 and is configured to serve as a source terminal and a drain terminal. The electrode 321 is configured to serve as a control terminal. The transistor 31 illustrated in FIG. 3 is an n-type insulated gate field effect transistors. Although not illustrated, a p-type insulated gate field effect transistor is provided in the surface portion of the substrate 30.

In the surface portion of the substrate 30, an element isolator 32 is provided between the adjacent transistors 31. The element isolator 32 includes a trench formed from a surface of the substrate 30 in a depth direction, and an insulating body buried in the trench. A symbol for the trench is omitted, and a symbol for the insulating body is omitted.

The third wiring layer 320 includes the electrode 321 described above, wires 322 in a plurality of layers, and an insulating layer 323. The wires 322 are provided on a surface on the second base body 200 side of the substrate 30. Although the number of wiring layers is not limited, the wires 322 here are provided in four layers. The wires 322 in the respective wiring layers are coupled to each other using plug wires, for which symbols are omitted. The insulating layer 323 is formed by stacking, for example, a silicon oxide film and a silicon nitride film.

The terminal 325 is provided on the second base body 200 side of the third wiring layer 320. The terminal 325 is coupled to the terminal 225 in the second base body 200. The terminal 325 includes copper, for example.

Within the pixel region 2 in the solid-state imaging device 1 configured as described above, a charge fixing film 140, an insulating film 150, and a light receiving lens 160 are sequentially provided on a surface on the light incident side of the first base body 100. Furthermore, a light shielding film 135 is provided in the pixel isolation region 130. The light shielding film 135 includes tungsten, for example.

(4) Structure in Peripheral Region 3 (External Terminals 324, Openings 4, and Isolators 5)

Figure 4:
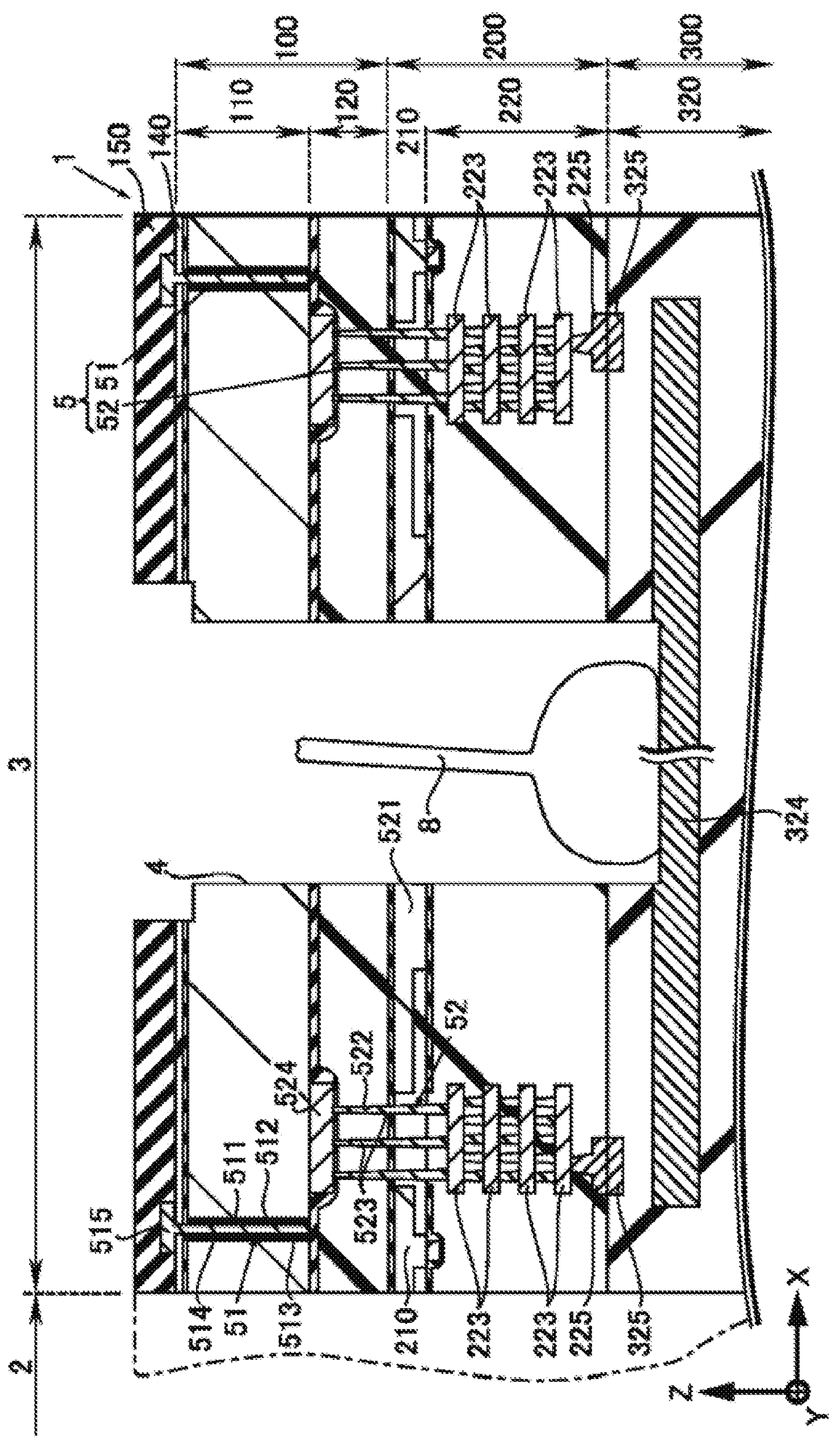
FIG. 4 is a longitudinal cross-sectional configuration diagram of a peripheral region in the solid-state imaging device illustrated in FIG. 1 (a cross-sectional diagram taken along line A-A illustrated in FIG. 1).
Figure 5:
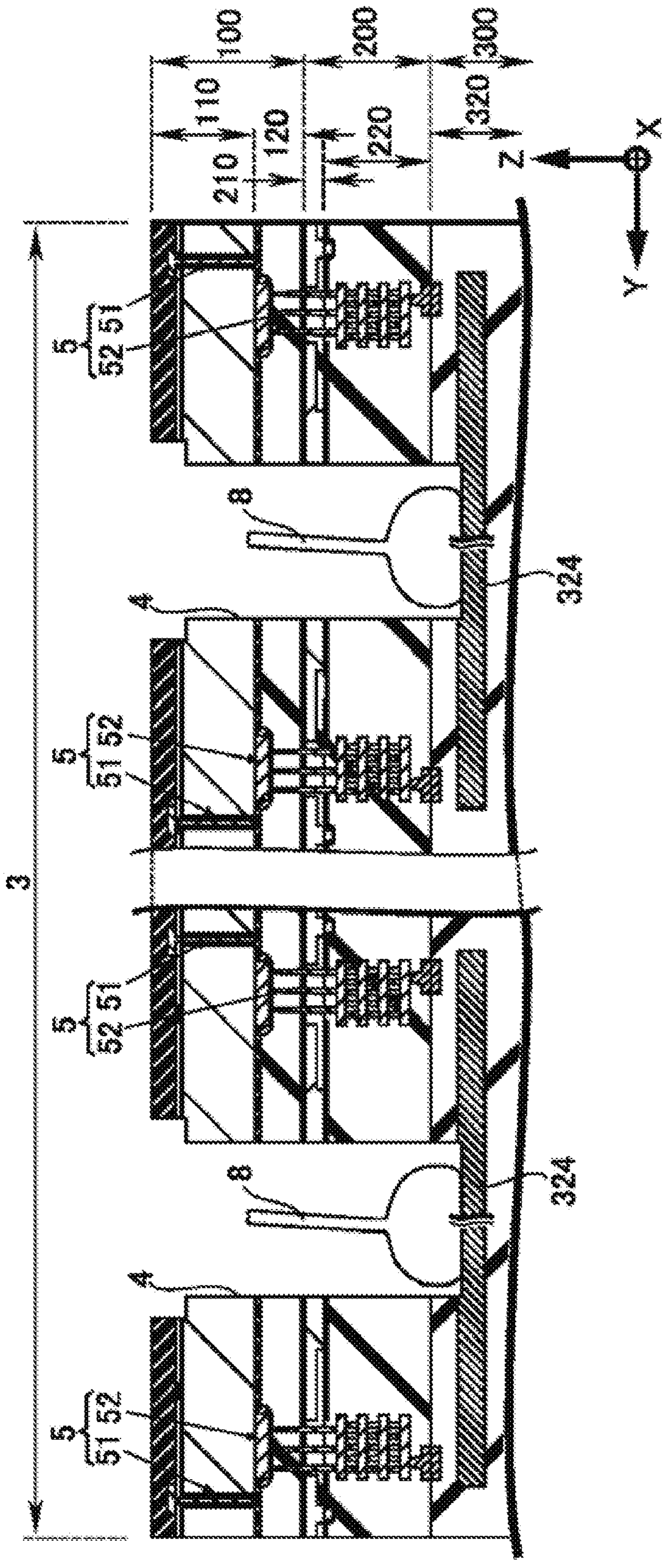
FIG. 5 is a longitudinal cross-sectional configuration diagram of the peripheral region in the solid-state imaging device illustrated in FIG. 1 (a cross-sectional diagram taken along line B-B illustrated in FIG. 1).
Figure 6:
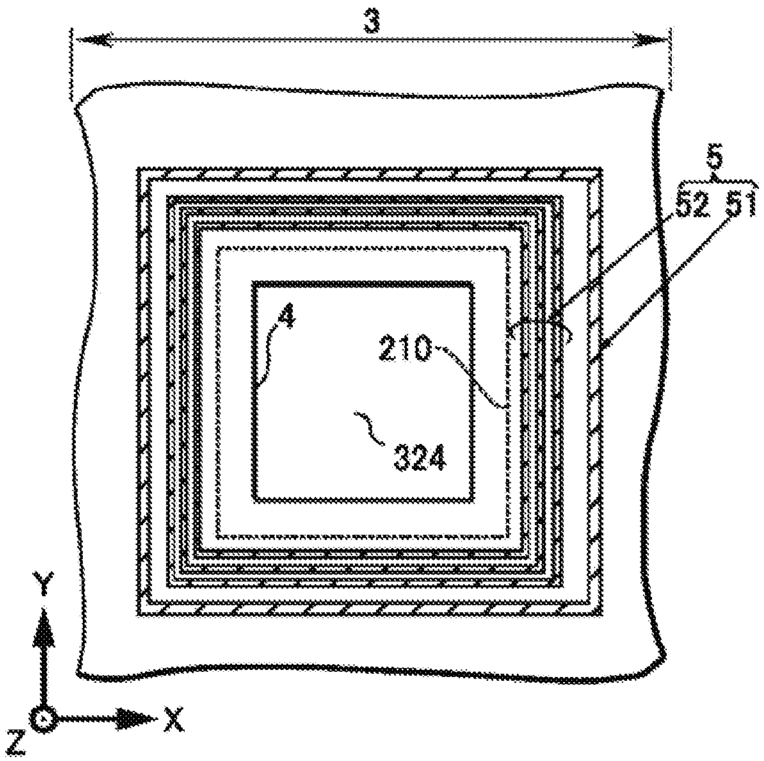
FIG. 6 is an enlarged plan view of an external terminal and an isolator (an insulating structure body) provided within the peripheral region in the solid-state imaging device illustrated in FIG. 1.

Within the peripheral region 3 illustrated in FIG. 1, the external terminals 324, the openings 4, and the isolators 5 are provided, as illustrated in FIGS. 4 to 6.

In the first embodiment, the external terminals 324 are formed in same electrically-conductive layer as that where the wire 322 closest to the first base body 100 is formed in the third wiring layer 320 in the third base body 300, and includes the same electrically-conductive material as the wire 322. The external terminals 324 include aluminum (Al), as a main composition, for example. As illustrated in FIG. 6, the external terminals 324 are each formed, as viewed in a plan view, into a rectangular shape, more specifically, a square shape.

From the surface on the light incident side of the first base body 100, the openings 4 are each formed by digging down and penetrating through the first base body 100, the second base body 200, and a portion of the insulating layer 323 in the third base body 300 to expose the surface of the external terminal 324. The openings 4 are each formed, as viewed in a plan view, into a rectangular shape that is smaller in size than a contour shape of the external terminal 324.

The isolators 5 each include a first isolator 51 and a second isolator 52. The first isolator 51 is provided in the first semiconductor layer 110 in the first base body 100. The first isolator 51 includes a trench 511, a pinning region 512, an insulating film 513, and a light shielding film 514. The trench 511 is provided to surround a whole outer periphery of the opening 4, and is formed to penetrate through the first semiconductor layer 110 in the thickness direction. Excluding a corner portion of the opening 4, a distance from the trench 511 to an inner wall of the opening 4 is constant. As viewed in a plan view, the trench 511 is formed into a rectangular shape surrounding the outer periphery of the opening 4. The pinning region 512 is formed along an inner wall of the trench 511. The insulating film 513 is formed along the inner wall of the trench 511 with the pinning region 512 interposed therebetween. The light shielding films 514 is buried in the trench 511 with the insulating film 513 interposed therebetween.

The trench 511, the pinning region 512, the insulating film 513, and the light shielding film 514 in the first isolator 51 are configured with the same cross-sectional structures as those of the trench 131, the pinning region 132, the insulating film 133, and the light shielding film 134 in the pixel isolation region 130. In addition, the pinning region 512 in the first isolator 51 includes the same material as the pinning region 132 in the pixel isolation regions 130. Similarly, the insulating film 513 includes the same material as the insulating films 133. The light shielding film 514 includes the same material as the light shielding films 134. Furthermore, similarly to the light shielding film 135 in the pixel isolation region 130, a light shielding film 515 is provided on a surface on the light incident side of the first isolator 51. Note that the pinning region 512 may not be formed in the first isolator 51. Each light shielding film 514 may not be formed in the first isolator 51. Furthermore, a p-type semiconductor region may be formed along a side wall of the trench 511 in the first semiconductor layer 110. It is possible to form the p-type semiconductor region with a solid phase diffusion technology or a plasma doping technology, for example.

The second isolator 52 is provided in the second semiconductor layer 210 in the second base body 200. The second isolator 52 includes an insulating body 521, trenches 522, buried bodies 523, and an isolation body 524. The insulating body 521 is provided to surround the whole outer periphery of the opening 4, and is formed at a position closer to the opening 4 than the first isolator 51. The insulating body 521 is formed in a whole region in the thickness direction of the second semiconductor layer 210. The trenches 522 are formed to penetrate through the insulating body 521 in the thickness direction, and are provided to surround the whole outer periphery of the opening 4. As viewed in a plan view, the trenches 522 are each formed into a rectangular shape surrounding the outer periphery of the opening 4. In the first embodiment, the three trenches 522 are provided at equal intervals between the first isolator 51 and the opening 4. The trenches 522 are not limited to three in number. There may be one, two, four or more trenches 522. The buried bodies 523 are buried in the trenches 522. The isolation body 524 is provided and coupled to a side on the first base body 100 side of the buried bodies 523. Note that there is a plurality of insulating films between the isolation body 524 and the buried body 523 in actual cases. However, the plurality of insulating films is formed with an opening. The isolation body 524 and the buried bodies 523 are thus in contact with each other via the opening. Note that insulating films may be provided to isolate the isolation body 524 and the buried bodies 523 from each other.

The insulating body 521, the trenches 522, the buried bodies 523, and the isolation body 524 in the second isolator 52 are configured with the same cross-sectional structures as those of the insulating body 231, the through hole 232, the through wire 233, and the electrode 114 in the full trench area 230. That is, the second isolator 52 is configured with the same cross-sectional structure as that of the full trench area 230 (circuit isolator). In addition, the insulating body 521 in the second isolator 52 includes the same material as the insulating body 231 in the full trench area 230. Similarly, the buried bodies 523 include the same material as the through wires 233. The isolation body 524 includes the same material as the electrodes 114, i.e., includes polycrystalline silicon, for example. Furthermore, the isolation body 524 may include the same material as the first electrode terminal 121 and the second electrode terminal 122, i.e., may include polycrystalline silicon, for example. In a case where the isolation body 524 has an electrically conductive property, the isolation body 524 and the first semiconductor layer 110 are electrically isolated from each other by an insulating body provided interposed therebetween. As such an insulating body provided between the isolation body 524 and the first semiconductor layer 110, it is possible to use, for example, a silicon oxide film having a thickness of several nm or greater and several tens of nm or less. Note that the isolation body 524 here includes an electrically-conductive material such as polycrystalline silicon. However, the isolation body 524 may include an insulating material.

As illustrated in FIGS. 1, 4, and 5, the isolator 5 is provided for each of a plurality of the external terminals 324 (the openings 4). That is, between two adjacent external terminals 324, the isolator 5 provided around one of the external terminals 324 and the isolator 5 provided around the other one of the external terminals 324 are provided.

As illustrated in FIG. 4, the external terminal 324 is coupled to the wire 8 through the opening 4. For the wire 8, a gold (Au) wires or a copper wire is used, for example. Note that, between two adjacent external terminals 324, the isolator 5 provided around one of the two adjacent external terminals 324 may be used as the isolator 5 provided around the other one of the two adjacent external terminals 324 (see FIGS. 1 and 5). That is, it is possible to provide one isolator 5 between two adjacent external terminals 324. Furthermore, the isolator 5 may be provided in a portion between the external terminal 324 and the dicing region 7 of a periphery of the external terminal 324. In this case, it is possible to effectively suppress occurrence of a crack and chipping due to a dicing step. Furthermore, the isolator 5 may be provided in a portion between the external terminal 324 and the pixel region 2 of the periphery of the external terminals 324 In this case, even if the wire 8 comes in contact with the inner wall of the opening 4, it is possible to effectively suppress a leak phenomenon into the pixel region 2.

[Method of Manufacturing Solid-state Imaging Device 1]

The method of manufacturing the solid-state imaging device 1 according to the first embodiment, in particular, a method of manufacturing the peripheral region 3 includes the following manufacturing steps illustrated in FIGS. 7 to 22. The method of manufacturing the peripheral region 3 will now be described below in detail.

(1) Manufacturing of First Isolator 51 of Isolators 5

Figure 7:
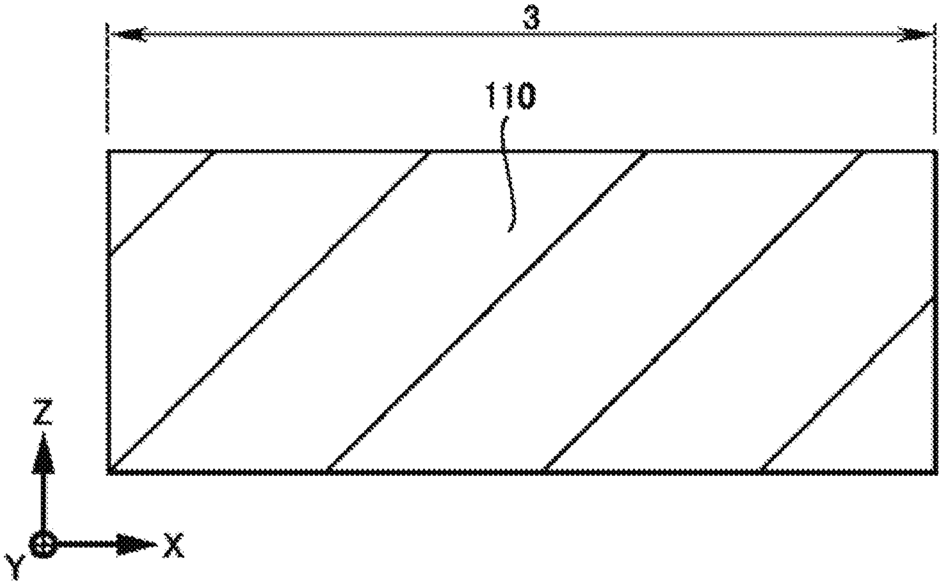
FIG. 7 is a cross-sectional diagram of a first step for describing a method of manufacturing the solid-state imaging device according to the first embodiment.

As illustrated in FIG. 7, the first semiconductor layer 110 that serves as a base of the first base body 100 is first prepared. The first semiconductor layer 110 is a single crystal silicon substrate (wafer), for example.

Figure 8:
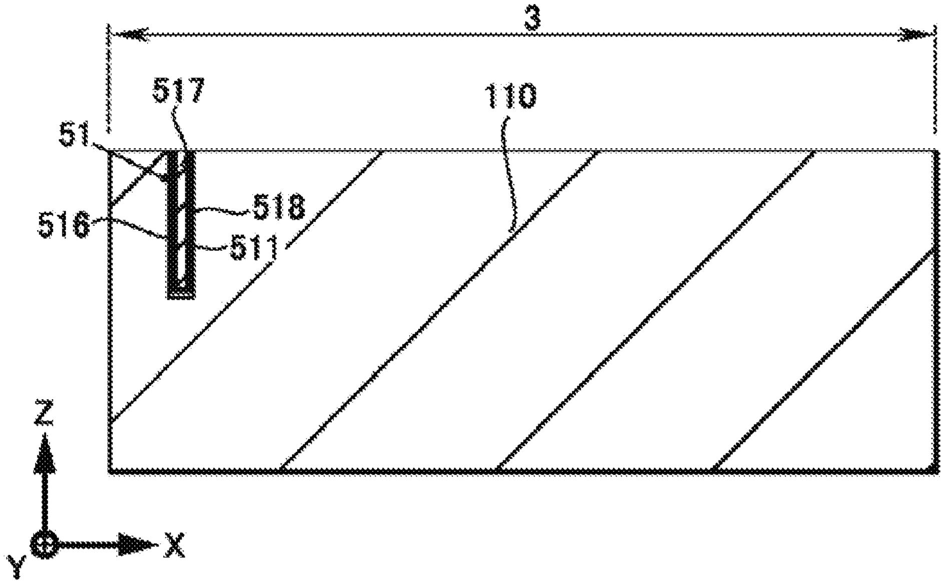
FIG. 8 is a cross-sectional diagram of a second step, which corresponds to FIG. 7.

As illustrated in FIG. 8, within the peripheral region 3, a portion of the first isolator 51 of the isolator 5 is formed on a surface portion of the first semiconductor layer 110. The surface portion of the first semiconductor layer 110 on which the portion of the first isolator 51 is formed is located on side opposite the light incident side illustrated in FIGS. 4 and 5. The trench 511 is first formed in the first isolator 51 by the same step as a step of forming the trench 131 of the pixel isolation region 130 in the pixel region 2. To form the trench 511, a photolithography technology and an anisotropic etching technology are used. In the pixel isolation region 130, a p-type semiconductor region, an insulating film, and a buried body, which are not illustrated, are sequentially formed. Through the same step as the steps, the p semiconductor region 515, an insulating film 516, and a buried body 517 are sequentially formed in the first isolator 51. A p-type semiconductor region 518 is formed, along at least a side wall of the trench 511 in the first semiconductor layer 110. To form the p-type semiconductor region 518, a solid phase diffusion technology or a plasma doping technology is used, for example. The insulating film 516 is formed, along the side wall and a bottom of the trench 511 on the first semiconductor layer 110. To form the insulating films 516, a thermal oxidation technology is used, for example. The buried body 517 is formed on the insulating films 516 in the trench 511. To form the buried body 517, a chemical vapor deposition technology or an atomic layer deposition technology, and a chemical mechanical polishing technology are used, for example.

(2) Manufacturing of Second Isolator 52 of Isolator 5

Figure 9:
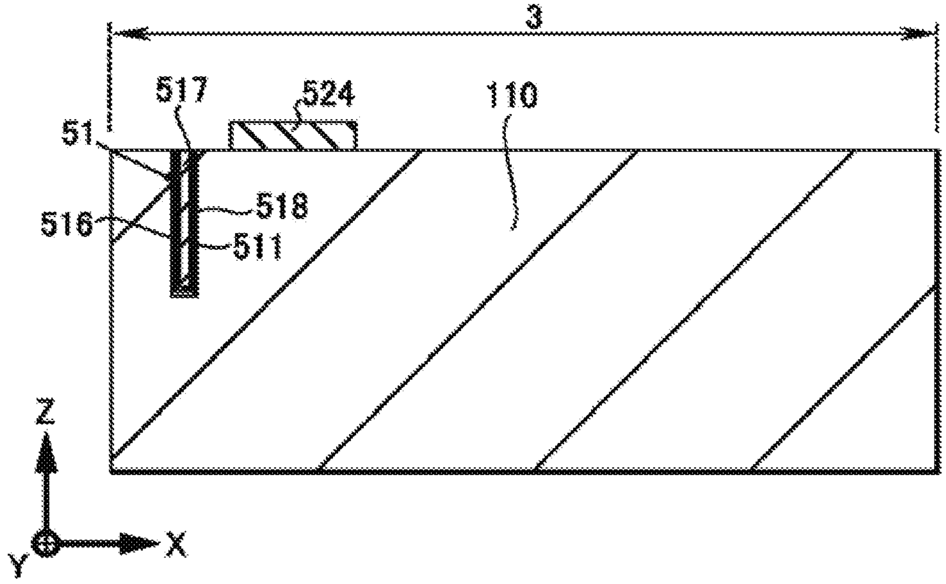
FIG. 9 is a cross-sectional diagram of a third step, which corresponds to FIG. 7.

As illustrated in FIG. 9, within the peripheral region 3, the isolation body 524 of the second isolator 52 is formed on a surface of the first semiconductor layer 110. The isolation body 524 is formed through the same step as a step of forming the electrode 114 in the pixel region 2. The electrode 114 is formed, which substantially complete the first wiring layer 120 in the first base body 100.

Figure 10:
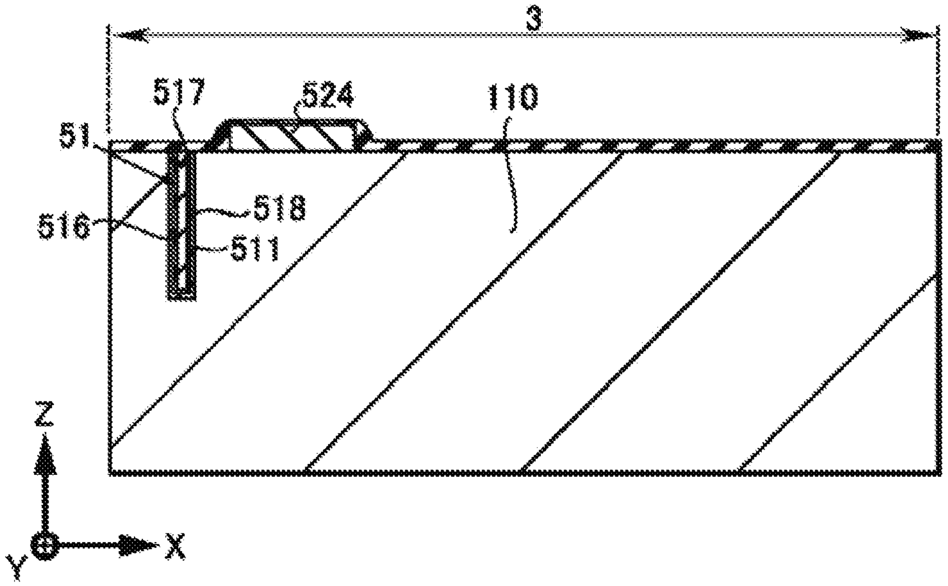
FIG. 10 is a cross-sectional diagram of a fourth step, which corresponds to FIG. 7.

Although any symbols are omitted, a side wall spacer is formed on the side wall of the isolation body 524, as illustrated in FIG. 10. Furthermore, an insulating film that covers the isolation body 524 and the side wall spacer is formed. Note that no side wall spacer is formed in a case where the isolation body 524 is formed through the same step as a step of forming each of the first electrode terminal 121 and the second electrode terminal 122.

Figure 11:
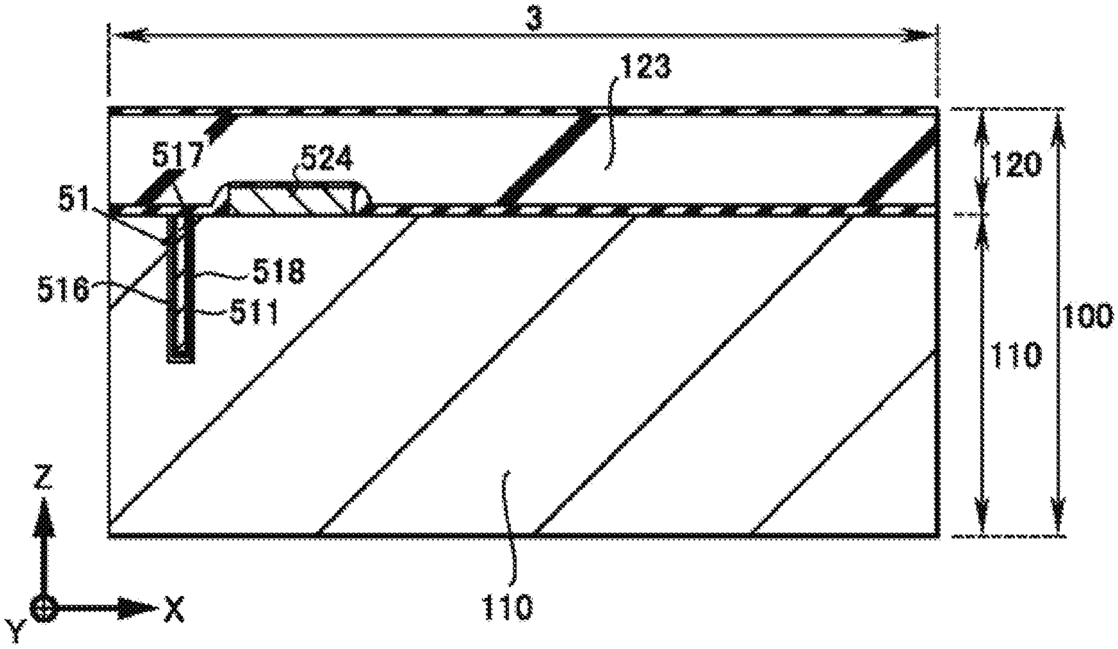
FIG. 11 is a cross-sectional diagram of a fifth step, which corresponds to FIG. 7.

As illustrated in FIG. 11, within the pixel region 2 and the peripheral region 3, the insulating layer 123 is formed on the surface of the first semiconductor layer 110. The isolation body 524 is covered by the insulating layer 123. The insulating layer 123 is formed, which thereby completes the first base body 100.

Figure 12:
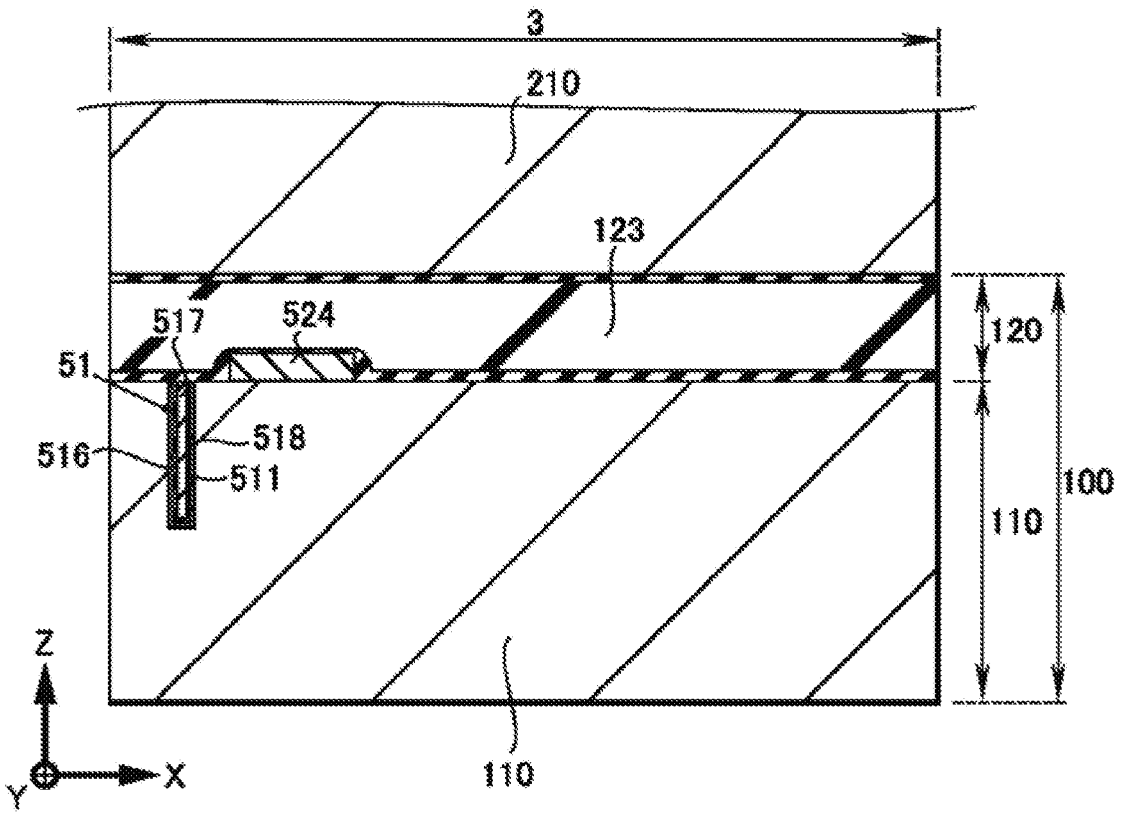
FIG. 12 is a cross-sectional diagram of a sixth step, which corresponds to FIG. 7.
Figure 13:
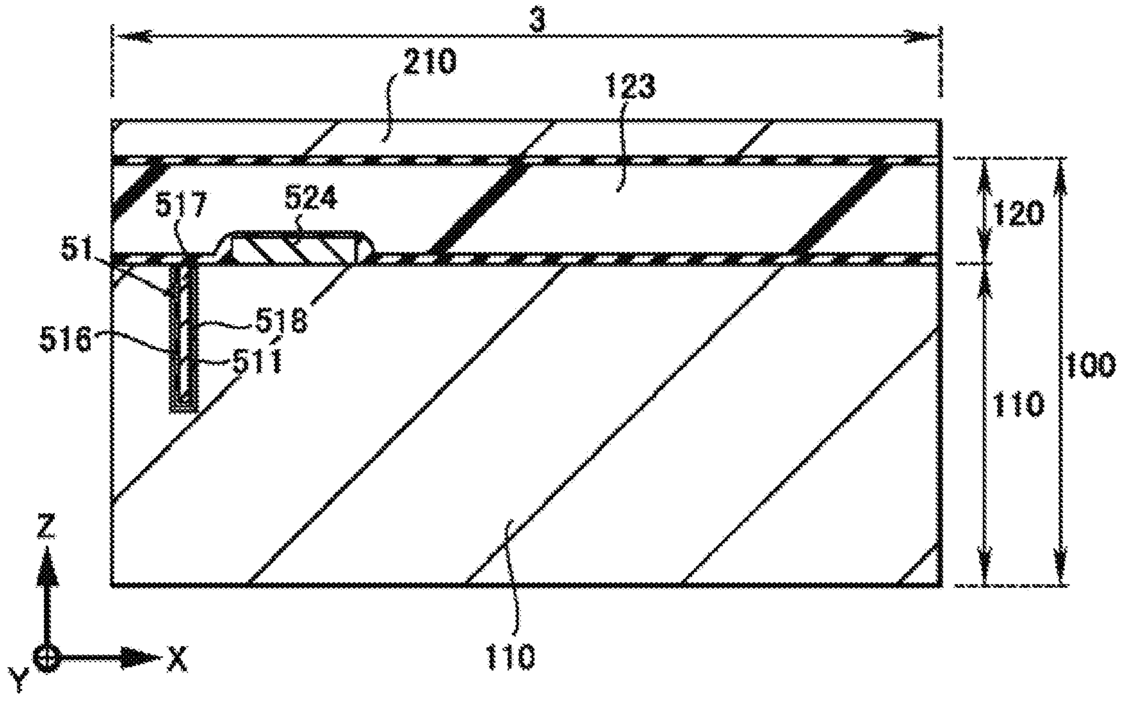
FIG. 13 is a cross-sectional diagram of a seventh step, which corresponds to FIG. 7.

As illustrated in FIG. 12, the second semiconductor layer 210 is joined to the first semiconductor layer 110 with the insulating layer 123 interposed therebetween. Similarly to the first semiconductor layer 110, the second semiconductor layer 210 is a single crystal silicon substrate (wafer). As illustrated in FIG. 13, the second semiconductor layer 210 undergoes polishing in the thickness direction. The second semiconductor layer 210 is thus thinned.

Figure 14:
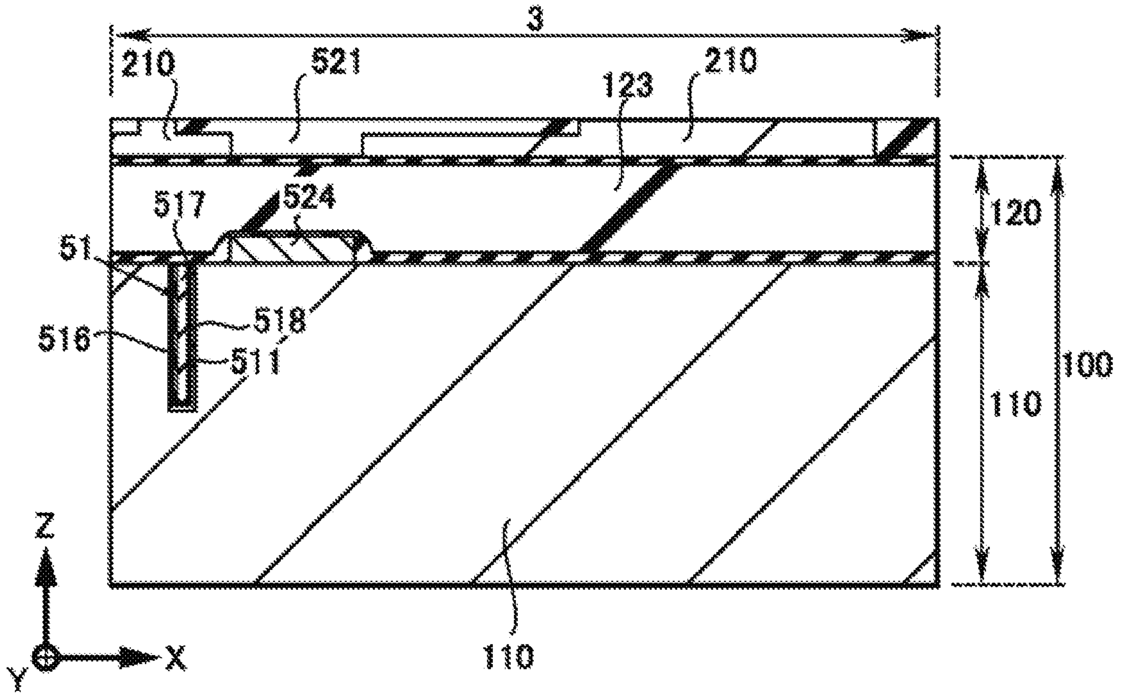
FIG. 14 is a cross-sectional diagram of an eighth step, which corresponds to FIG. 7.

As illustrated in FIG. 14, within the peripheral region 3, a region where the second isolator 52 is to be formed in the second semiconductor layer 210 is removed. In the region that has undergone the removal, the insulating body 521 is formed. The insulating body 521 is formed above the isolation body 524. The insulating body 521 is formed through the same step as a step of forming the insulating body 231 in the full trench area 230.

Figure 15:
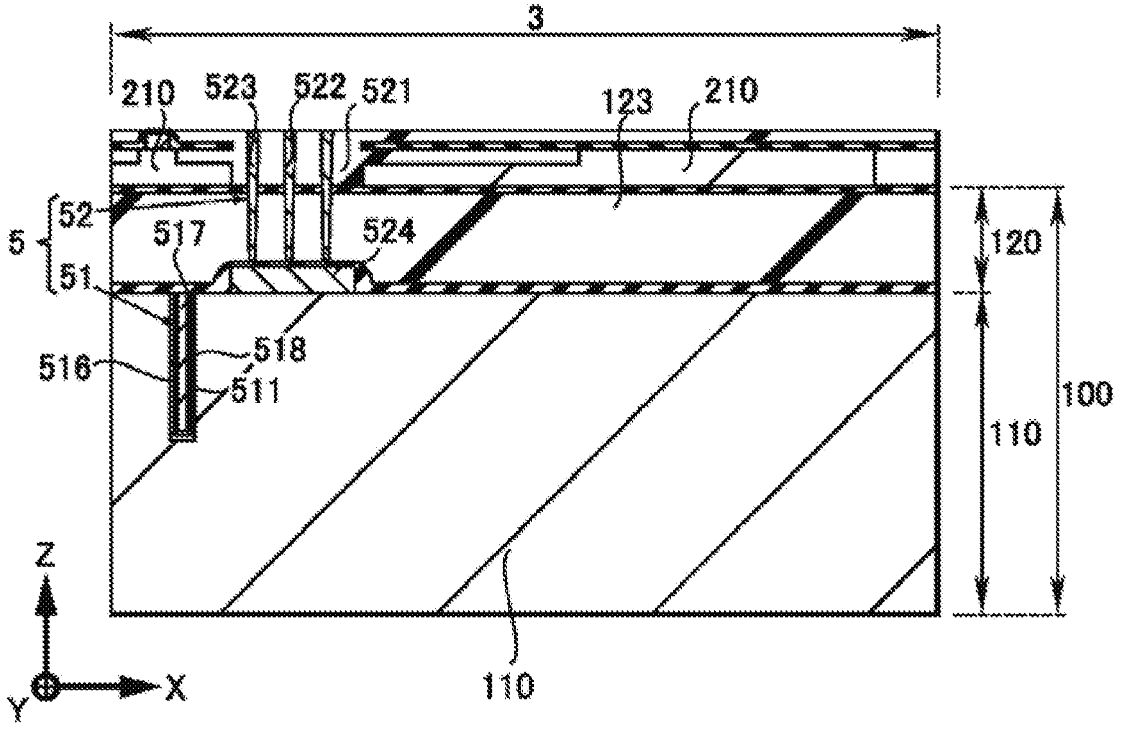
FIG. 15 is a cross-sectional diagram of a ninth step, which corresponds to FIG. 7.

Within the peripheral region 3, the trenches 522 that reach a surface of the isolation body 524 are formed in the insulating body 521. The trenches 522 are formed through a photolithography technology and an anisotropic etching technology. The trenches 522 are formed through the same step as a step of forming the through hole 232 in the full trench area 230. As illustrated in FIG. 15, the buried bodies 523 are buried in the trenches 522. To form the buried bodies 523, a chemical vapor deposition technology or an atomic layer deposition technology, and a chemical mechanical polishing technology are used, for example. The buried bodies 523 are formed through the same step as a step of forming the through wire 233 in the full trench area 230. The buried bodies 523 are formed, which thereby completes the second isolator 52 including the insulating body 521, the trenches 522, the buried bodies 523, and the isolation body 524. Furthermore, the second isolator 52 is completed, which thereby completes the isolator 5 including the first isolator 51 and the second isolator 52.

Figure 16:
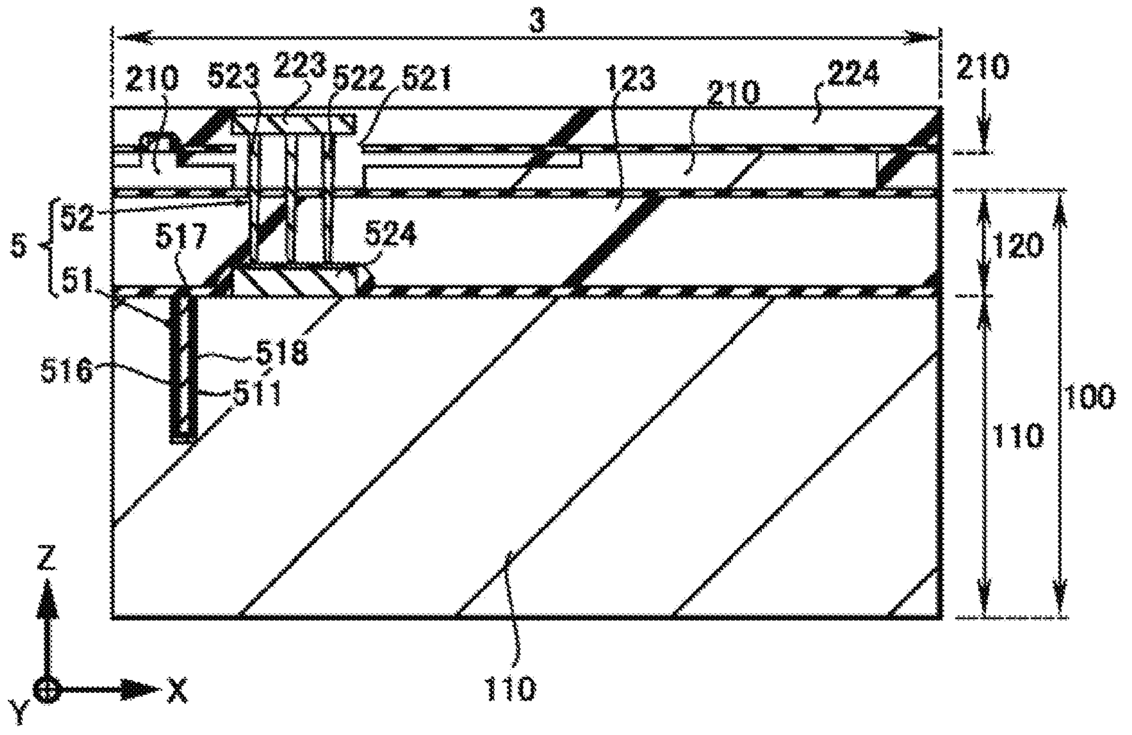
FIG. 16 is a cross-sectional diagram of a tenth step, which corresponds to FIG. 7.
Figure 17:
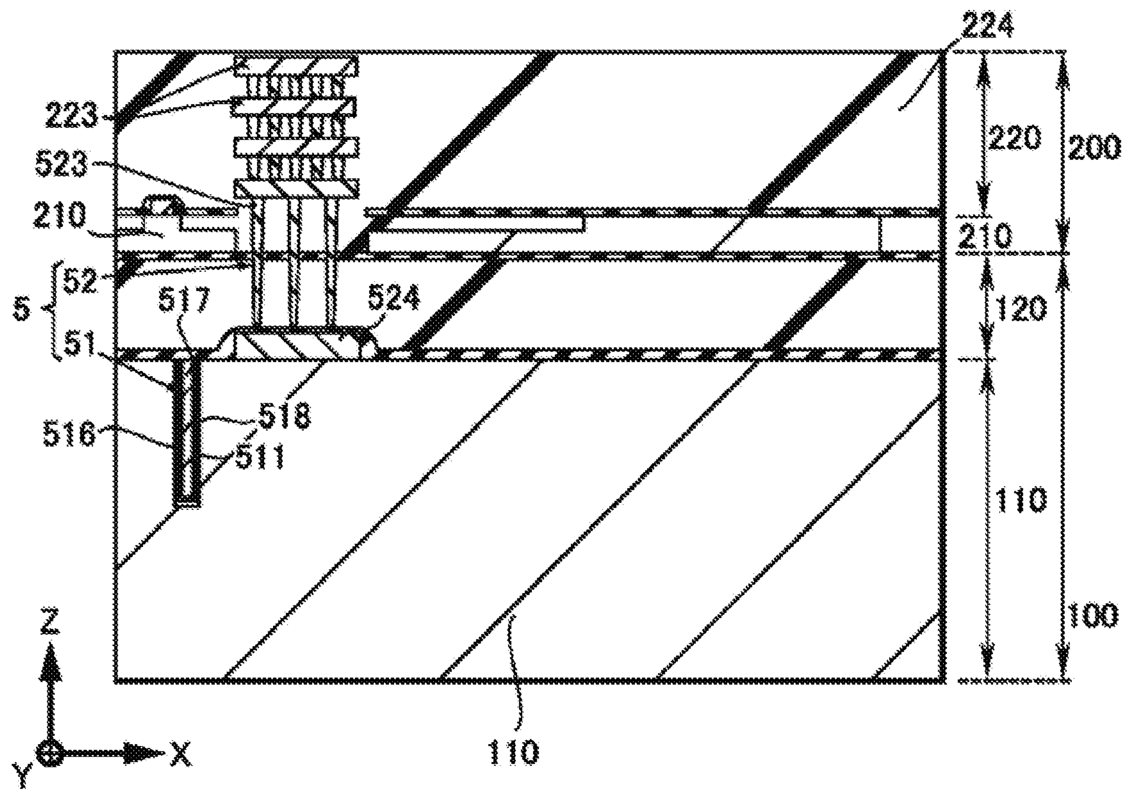
FIG. 17 is a cross-sectional diagram of an eleventh step, which corresponds to FIG. 7.

As illustrated in FIG. 16, some of the wires 223 and a portion of the insulating layer 224 in the second wiring layer 220 in the second base body 200 are formed on the surface of the second semiconductor layer 210. As illustrated in FIG. 17, rest of the wires 223 and a rest portion of the insulating layer 224 are then formed.

Figure 18:
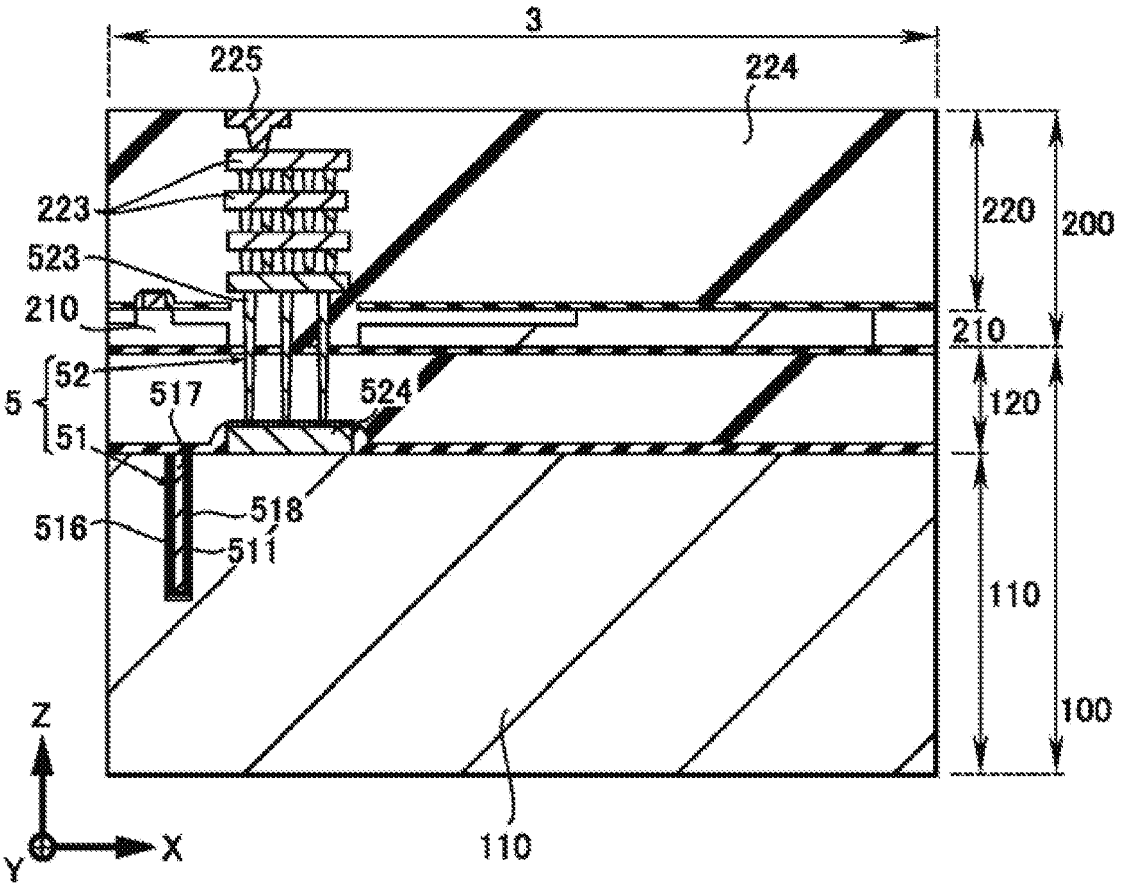
FIG. 18 is a cross-sectional diagram of a twelfth step, which corresponds to FIG. 7.

Furthermore, as illustrated in FIG. 18, the terminal 225 as an uppermost layer in the second wiring layer 220 is formed. The terminal 225 is formed, which thereby completes the second base body 200 including the second semiconductor layer 210 and the second wiring layer 220.

(3) Manufacturing of External Terminal 324 and Opening 4

Figure 19:
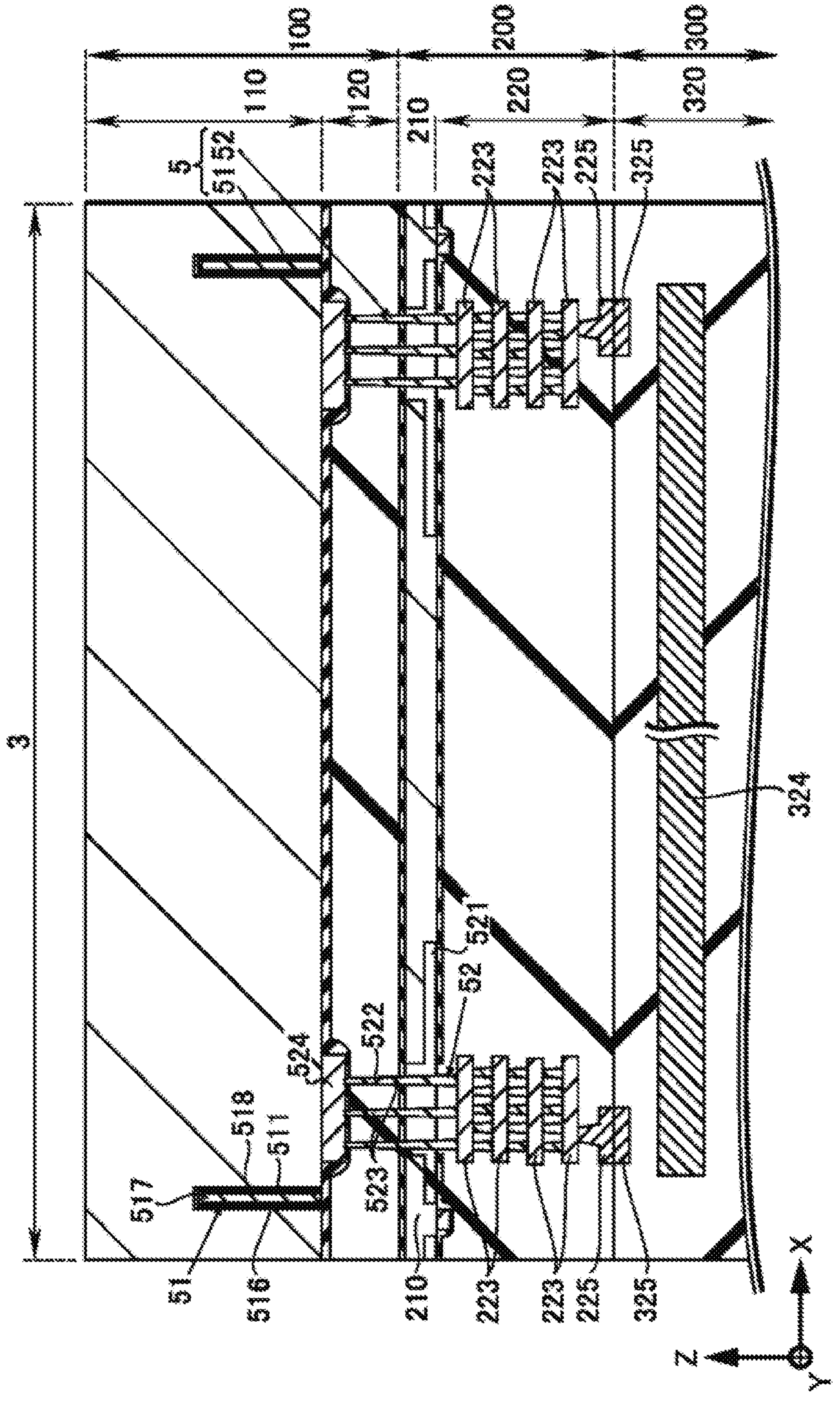
FIG. 19 is a cross-sectional diagram of a thirteenth step, which corresponds to FIG. 7.

Next, the first base body 100 and the second base body 200 are flipped vertically. The second base body 200 is then stacked on the third base body 300 (see FIG. 19). As illustrated in FIG. 3, the third base body 300 includes the substrate 30 on which the transistor 31 constituting the peripheral circuit is mounted. The third wiring layer 320 is provided on the surface of the substrate 30. The terminal 325 is provided in an uppermost layer of the third wiring layer 320. After the second base body 200 and the first base body 100 are stacked on the third base body 300, as illustrated in FIG. 19, the terminal 225 in the second base body 200 is joined to the terminal 325 in the third base body 300.

Figure 20:
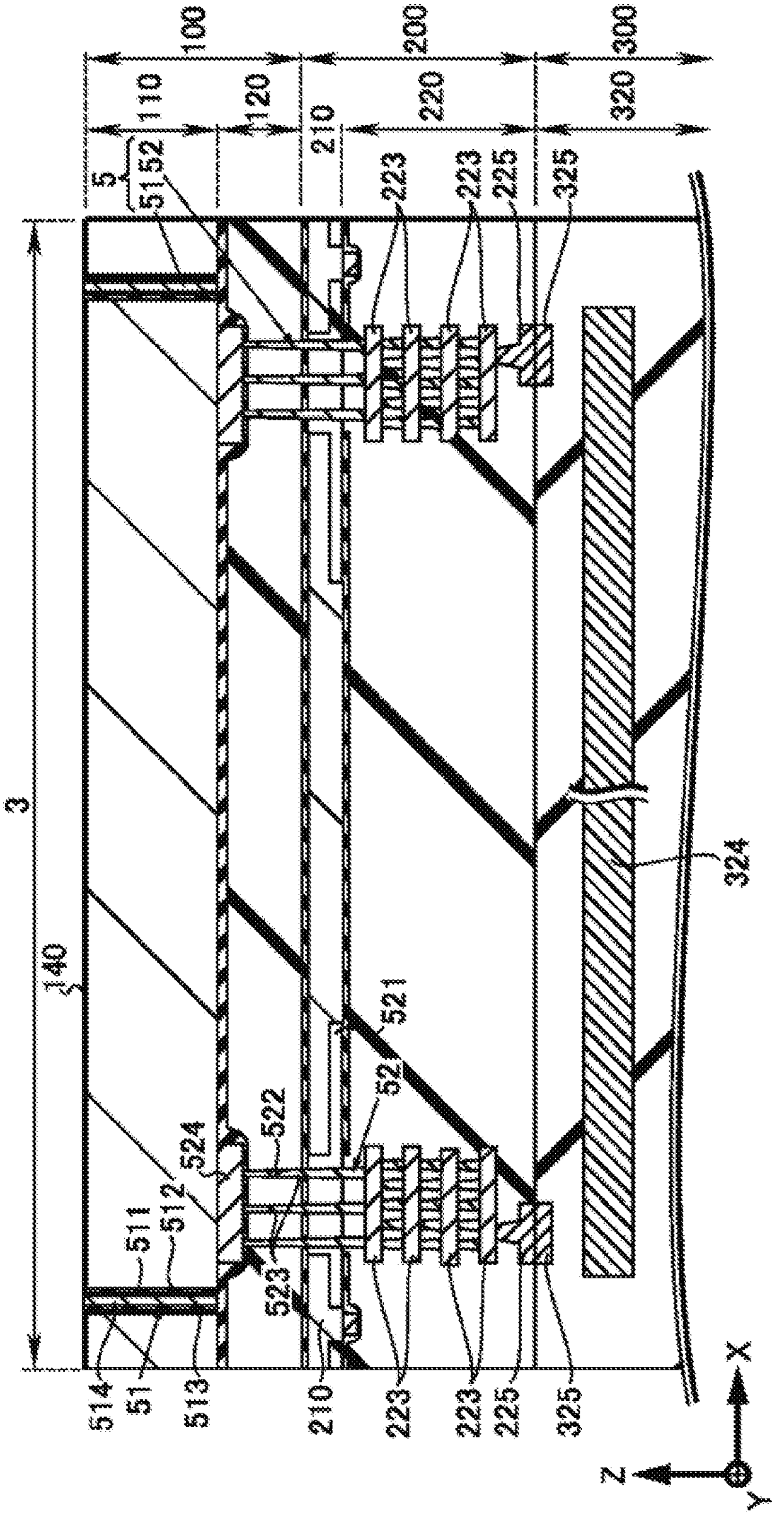
FIG. 20 is a cross-sectional diagram of a fourteenth step, which corresponds to FIG. 7.

The first semiconductor layer 110 in the first base body 100 undergoes polishing. The first semiconductor layer 110 is thus thinned (see FIG. 20). The first semiconductor layer 110 is thinned to expose the first isolator 51 on the surface of the first semiconductor layer 110. The buried body 517 and the insulating film 516 in the first isolator 51 are then selectively removed. As illustrated in FIG. 20, the pinning region 512, the insulating film 513, and the light shielding film 514 in the trench 511 are then sequentially formed. The pinning region 512, the insulating film 513, and the light shielding film 514 in the first isolator 51 are formed through the same step as a step of forming the pinning region 132, the insulating film 133, and the light shielding film 134 in the pixel isolation region 130. Furthermore, the charge fixing film 140 is formed on the surface on the light incident side of the first base body 100 through the same step as a step of forming the pinning region 132 in the pixel isolation region 130. The steps described so far have end, which thereby completes the first isolator 51. Furthermore, the first base body 100 including the first semiconductor layer 110 and the first wiring layer 120 is completed.

Figure 21:
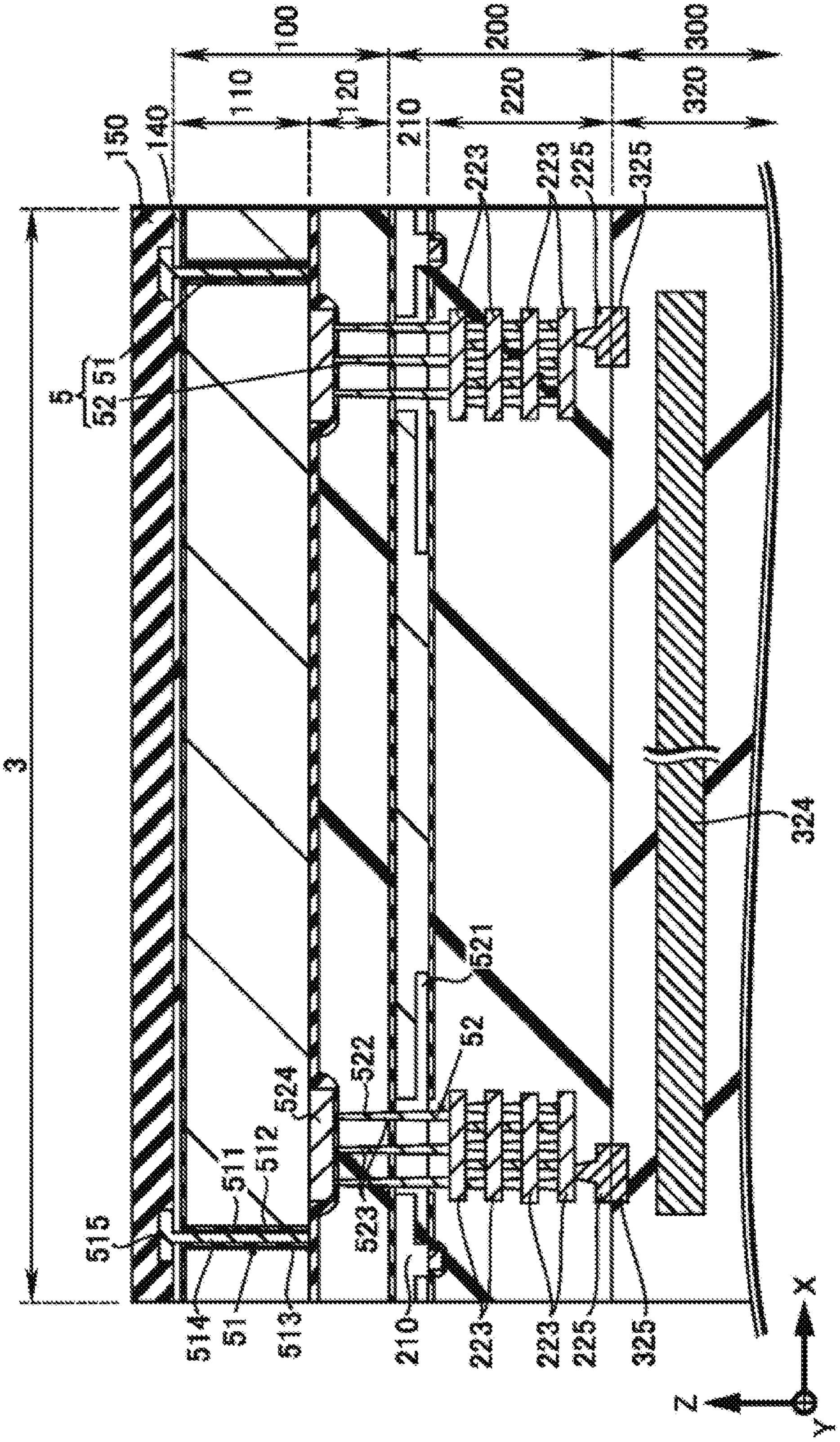
FIG. 21 is a cross-sectional diagram of a fifteenth step, which corresponds to FIG. 7.

Next, on the surface on the light incident side of the first base body 100, the light shielding film 515 is formed on the first isolator 51 in the isolator 5 (see FIG. 21). The light shielding film 515 is formed through the same step as a step of forming the light shielding film 135 on the pixel isolation region 130 in the pixel region 2. As illustrated in FIG. 21, within the pixel region 2 and the peripheral region 3, the insulating film 150 is formed on the surface on the light incident side of the first base body 100. After that, within the pixel region 2, the light receiving lens 160 is formed on the insulating film 150.

Figure 22:
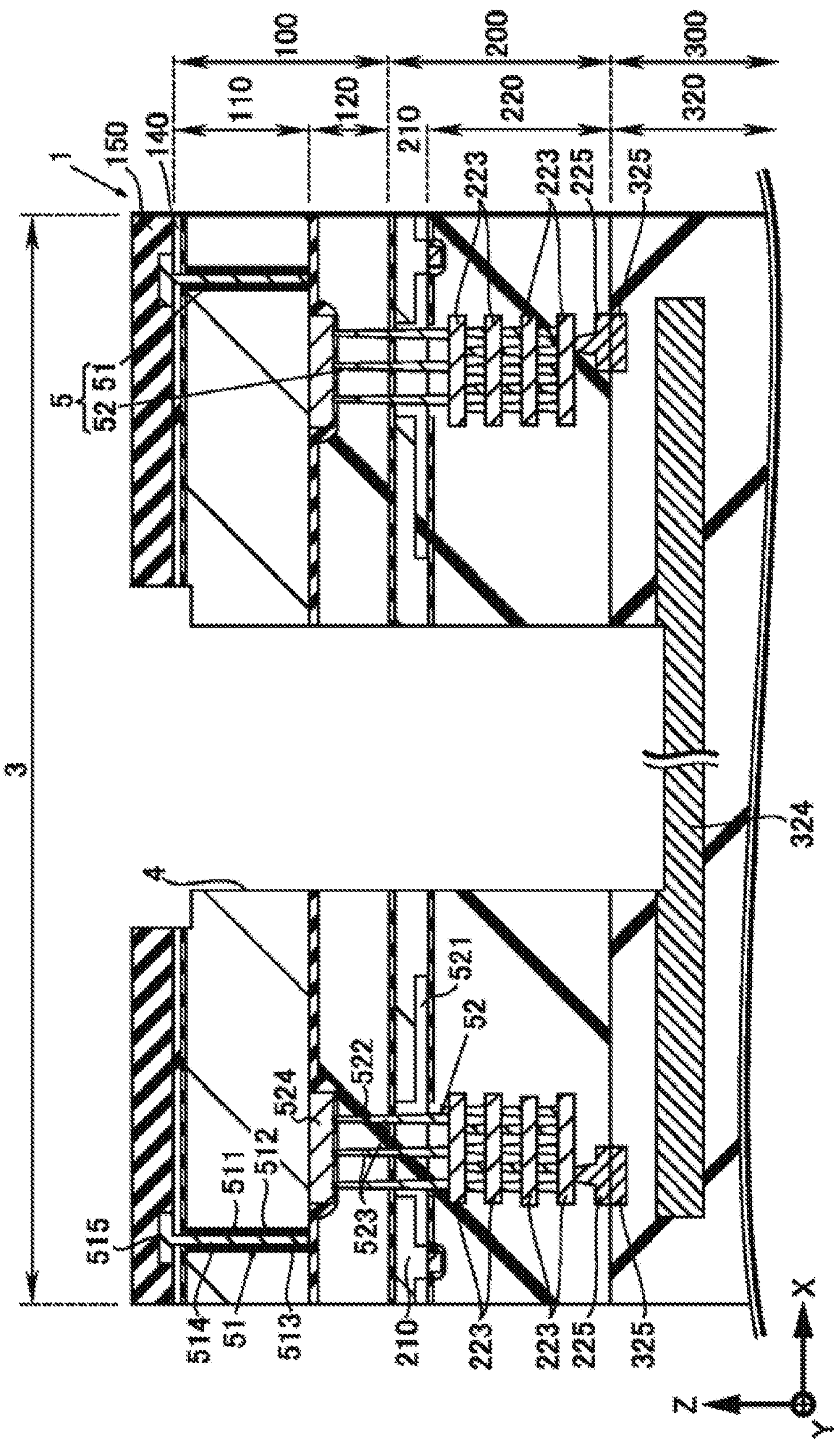
FIG. 22 is a cross-sectional diagram of a sixteenth step, which corresponds to FIG. 7.

As illustrated in FIG. 22, the opening 4 is formed in a region surrounded by the isolator 5 within the peripheral region 3. The opening 4 penetrates through the first base body 100 and the second base body 200 and reaches the surface of the external terminal 324 provided on the third base body 300. In the opening 4, the surface of the external terminal 324 is exposed.

After the series of manufacturing steps described so far has end, the solid-state imaging device 1 illustrated in FIGS. 1, and 3 to 6 is completed.

Workings and Effects

The solid-state imaging device 1 according to the first embodiment includes the first semiconductor layer 110 and the second semiconductor layer 210, as illustrated in FIGS. 1 to 3. The first semiconductor layer 110 has the pixel region 2 in which the plurality of pixels 20 is arranged, and the peripheral region 3 provided around the pixel region 2. The second semiconductor layer 210 is stacked on the first semiconductor layer 110 on side opposite to the light incident side of the pixels 20, and is provided with the pixel circuit 24 coupled to the pixels 20. The solid-state imaging device 1 further includes the external terminal 324, the first isolator 51, and the second isolator 52, as illustrated in FIGS. 1, and 4 to 6. The external terminal 324 is provided in the opening 4 that communicates with the second semiconductor layer 210 from the peripheral region 3 in the first semiconductor layer 110. Within the first semiconductor layer 110, the first isolator 51 is provided in the peripheral region 3, and surrounds at least a portion of the outer periphery of the opening 4. The second isolator 52 is provided in the second semiconductor layer 210 within a region corresponding to the peripheral region 3, and surrounds at least a portion of the outer periphery of the opening 4. Accordingly, even if the pixels 20 and the pixel circuit 24 are stacked, and the second semiconductor layer 210 is stacked on the first semiconductor layer 110, the first isolator 51 is provided in the first semiconductor layer 110, and the second isolator 52 is provided in the second semiconductor layer 210. In the solid-state imaging device 1, it is therefore possible to easily achieve the structure of the isolator 5 that forms an insulating structure body.

Furthermore, since the isolator 5 is provided in the solid-state imaging device 1, the first isolator 51 secures an insulating state of the wires 8 with respect to the pixels 20 in the first semiconductor layer 110. It is therefore possible to prevent a leak phenomenon between the pixels 20 and the wires 8. In the second semiconductor layer 210, the second isolator 52 secures an insulating state of the wires 8 with respect to the pixel circuit 24. It is therefore possible to prevent a leak phenomenon between the pixel circuit 24 and the wires. Furthermore, the first isolator 51 enhances mechanical strength of the first semiconductor layer 110. The second isolator 52 also enhances mechanical strength of the second semiconductor layer 210. It is therefore possible to suppress occurrence of a crack due to bonding of the wires 8 and occurrence of chipping at a chip end due to a dicing process.

Furthermore, in the solid-state imaging device 1, as illustrated in FIGS. 1 and 6, the first isolator 51 surrounds the whole outer periphery of the opening 4. It is therefore possible to enhance insulation performance of the first isolator 51, and it is possible to further enhance mechanical strength of the first semiconductor layer 110.

Furthermore, in the solid-state imaging device 1, as illustrated in FIGS. 1 and 6, the second isolator 52 surrounds the whole outer periphery of the opening 4. It is therefore possible to enhance insulation performance of the second isolator 52, and it is possible to further enhance mechanical strength of the second semiconductor layer 210.

Furthermore, in the solid-state imaging device 1, as illustrated in FIGS. 4 to 6, the first isolator 51 is provided, centered around the opening 4, at a position outside a position at which the second isolator 52 is provided. Accordingly, it is possible to enhance insulation performance of the second isolator 52 at a position close to the inner wall of the opening 4, and it is possible to enhance mechanical strength of the second semiconductor layer 210.

Furthermore, in the solid-state imaging device 1, as illustrated in FIGS. 4 and 5, the first isolator 51 has the trench 511 (first trench) formed in the thickness direction from the light incident side of the first semiconductor layer 110, and includes an insulating body (in the first embodiment, the pinning region 512, the insulating film 513, and the light shielding film 514) formed in the trench 511. It is therefore possible to easily achieve the structure of the first isolator 51 in the first semiconductor layer 110. The trench 511 in the first isolator 51 penetrates through the first semiconductor layer 110, similarly to the trench 131 in the pixel isolation region 130. It is therefore possible to easily achieve the structure of the first isolator 51.

Furthermore, in the solid-state imaging device 1, as illustrated in FIGS. 4 and 5, the second isolator 52 includes the trenches 522 (second trenches) formed in the thickness direction from the light incident side of the second semiconductor layer 210, the insulating body 231, and electrically-conductive bodies (in the first embodiment, the buried bodies 523) formed in the trenches 522. It is therefore possible to easily achieve the structure of the second isolator 52 in the second semiconductor layer 210. The trenches 522 in the second isolator 52 penetrate through the second semiconductor layer 210, similarly to the through hole 232 in the full trench area 230. It is therefore possible to easily achieve the structure of the second isolator 52.

Furthermore, the solid-state imaging device 1 includes the pixel isolation region 130 provided around the pixels 20 within the pixel region 2 in the first semiconductor layer 110, as illustrated in FIGS. 3 to 5. The pixel isolation region 130 isolates the plurality of pixels 20 from each other. The first isolator 51 is then configured by the same structure as that of the pixel isolation region 130. It is therefore possible to easily achieve the structure of the first isolator 51 in the first semiconductor layer 110.

Furthermore, the solid-state imaging device 1 includes the full trench area 230 (circuit isolator) penetrating through the second semiconductor layer 210 in the thickness direction in the pixel circuit 24 in the second semiconductor layer 210, as illustrated in FIGS. 3 to 5. The second isolator 52 is configured by the same structure as that of the circuit isolator. It is therefore possible to easily achieve the structure of the second isolator 52 in the second semiconductor layer 210.

Furthermore, in the method of manufacturing the solid-state imaging device 1, the pixel isolation region 130 that isolates the pixels 20 from each other is first formed around the plurality of pixels 20 within the pixel region 2 in the first semiconductor layer 110 (see FIG. 3). Through the same step as the step of forming the pixel isolation region 130, as illustrated in FIG. 20, the first isolator 51 is formed. The first isolator 51 surrounds at least a portion of the outer periphery of the opening 4 that communicates with the external terminal 324 provided within the peripheral region 3 around the pixel region 2. As illustrated in FIG. 12, on side opposite to the light incident side of the pixels 20, the second semiconductor layer 210 is formed on the first semiconductor layer 110. The second semiconductor layer 210 is provided with the pixel circuit 24 coupled to the pixels 20. In the pixel circuit 24, the full trench area 230 (circuit isolator) is then formed. The full trench area 230 (circuit isolator) penetrates through the second semiconductor layer 210 in the thickness direction (see FIG. 3). Through the same step as the step of forming the full trench area 230, as illustrated in FIGS. 9 to 15, the second isolator 52 is formed in the second semiconductor layer 210 within the peripheral region 3. The second isolator 52 surrounds at least a portion of the outer periphery of the opening 4. The first isolator 51 is therefore formed by utilizing the step of forming the pixel isolation region 130, and the second isolator 52 is formed by utilizing the step of forming the circuit isolator. That is, it is possible to reduce the number of steps of manufacturing the solid-state imaging device, as compared with a case where steps of forming the first isolator 51 and the second isolator 52 are separately provided.

[Modification Example of Solid-State Imaging Device 1]

Figure 23:
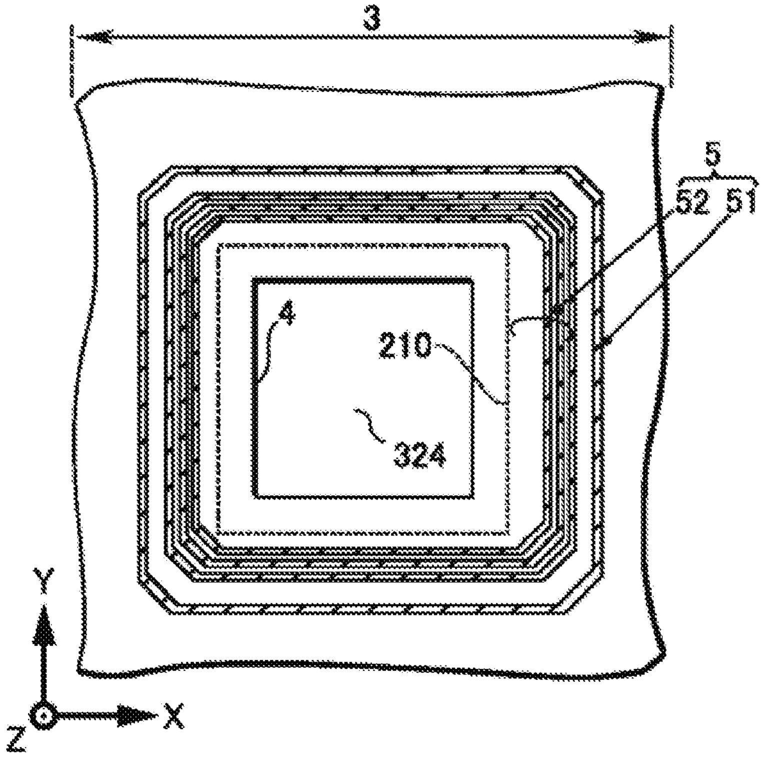
FIG. 23 is an enlarged plan view of an external terminal and an isolator according to a modification example to the first embodiment, which corresponds to FIG. 6.

In a solid-state imaging device 1 according to a modification example of the first embodiment, as illustrated in FIG. 23, a planar shape of the isolator 5 is changed. More specifically, in the first isolator 51, portions that correspond to corners of the opening 4, are each provided in an inclined manner on a plane in the arrow X direction and the arrow Y direction, as viewed in a plan view. That is, the planar shape of the first isolator 51 is formed into an octagonal shape. A planar shape of the second isolator 52 is similarly formed into an octagonal shape, as viewed in a plan view.

In the solid-state imaging device 1 configured as described above, the corners of the isolator 5 are each less sharpened in shape, which forms a structure resistant to concentrating a leakage and stress. It is therefore possible to effectively prevent occurrence of a leak phenomenon, a crack, or chipping.

Note that the planar shape of the isolator 5 may be formed into a polygonal shape, a circular shape, or an oval shape, instead of an octagonal shape.

2. Second Embodiment

Figure 24:
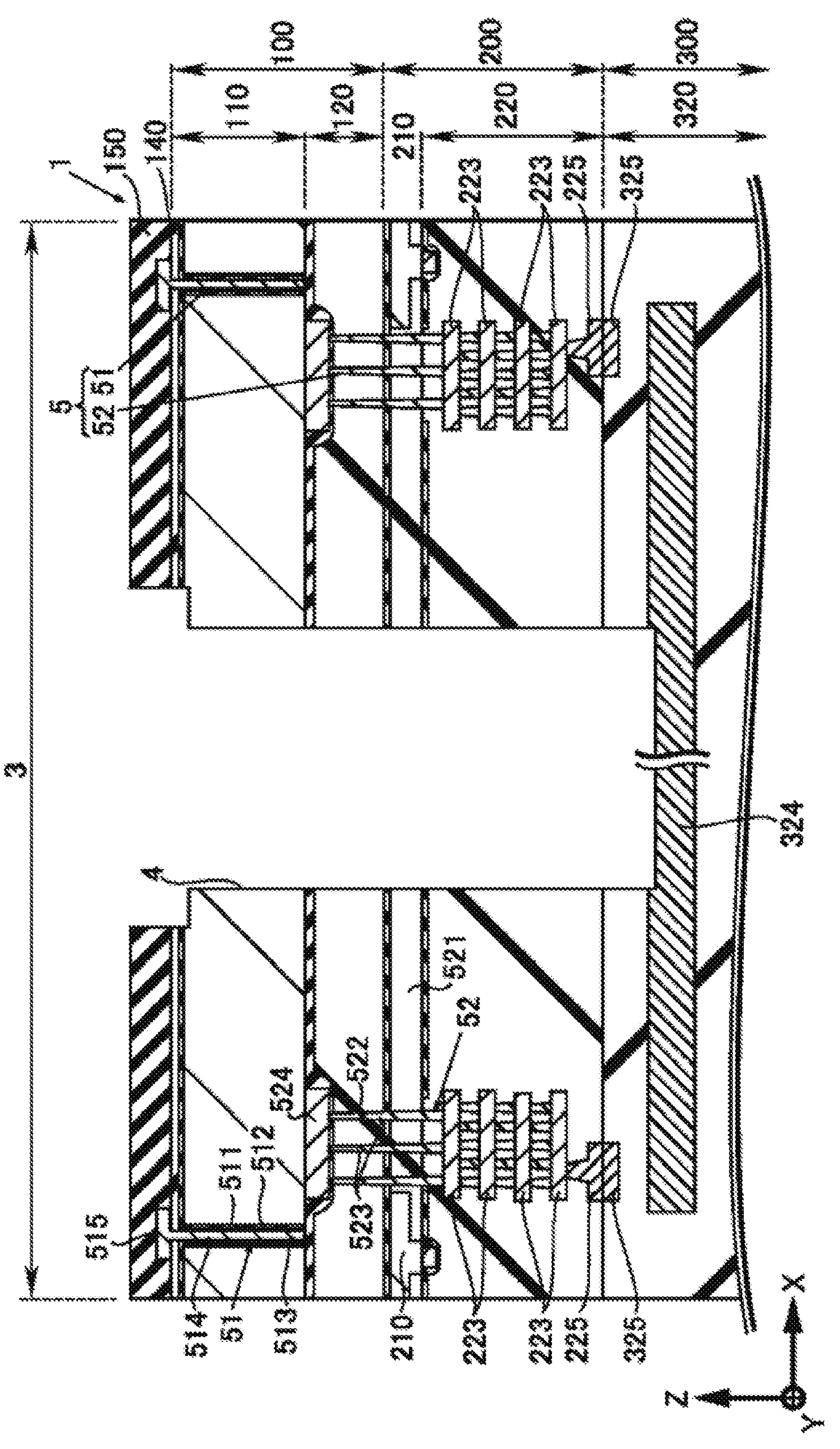
FIG. 24 is a longitudinal cross-sectional configuration diagram of a peripheral region in a solid-state imaging device according to a second embodiment of the present disclosure, which corresponds to FIG. 4.
Figure 25:
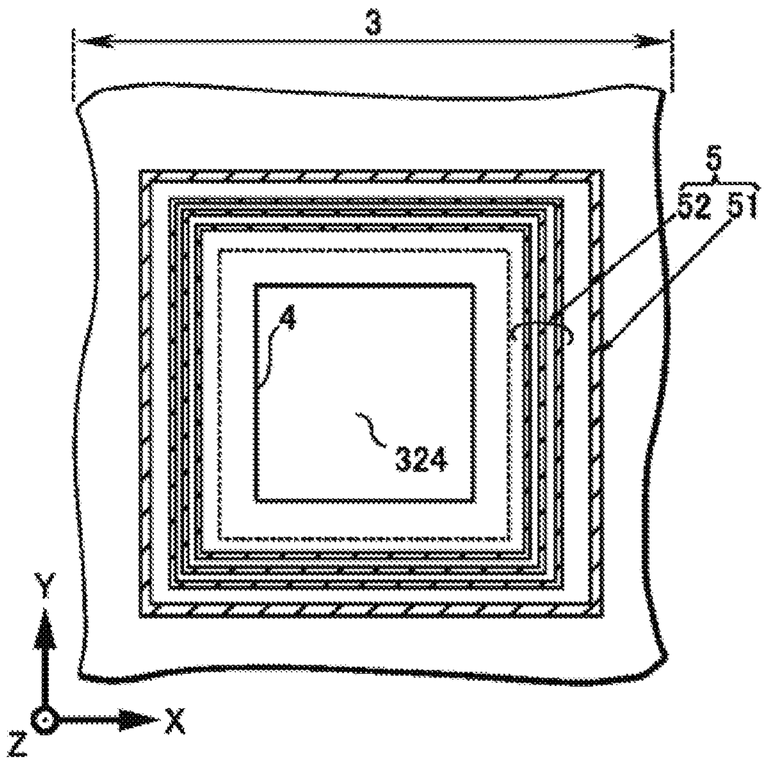
FIG. 25 is an enlarged plan view of an external terminal and an isolator provided within the peripheral region in the solid-state imaging device illustrated in FIG. 24, which corresponds to FIG. 4.

As to a solid-state imaging device 1 according to a second embodiment, such an example will now be described that, in the solid-state imaging device 1 according to the first embodiment, the structure of the second semiconductor layer 210 within the peripheral region 3 is changed. As illustrated in FIGS. 24 and 25, in the solid-state imaging device 1 according to the second embodiment, the second semiconductor layer 210 in a region surrounded by the second isolator 52 is not provided within the peripheral region 3. The insulating body 521 is provided in a portion corresponding to the second semiconductor layer 210. Excluding this configuration, the solid-state imaging device 1 according to the second embodiment has the same configuration as the solid-state imaging device 1 according to the first embodiment.

With the solid-state imaging device 1 configured as described above, it is possible to achieve workings and effects similar to the workings and effects achieved with the solid-state imaging device 1 according to the first embodiment.

3. Third Embodiment

Figure 26:
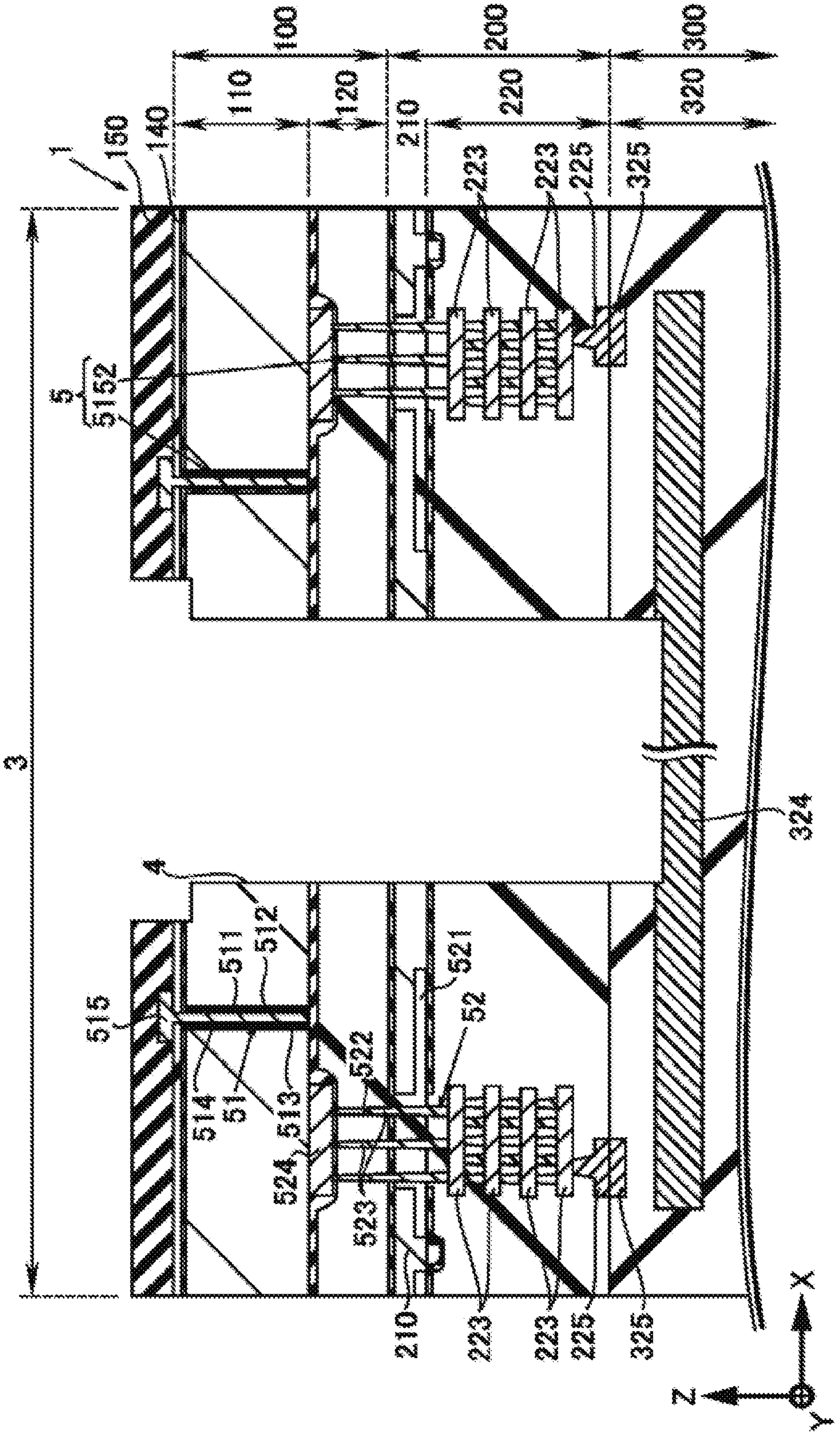
FIG. 26 is a longitudinal cross-sectional configuration diagram of a peripheral region in a solid-state imaging device according to a third embodiment of the present disclosure, which corresponds to FIG. 4.
Figure 27:
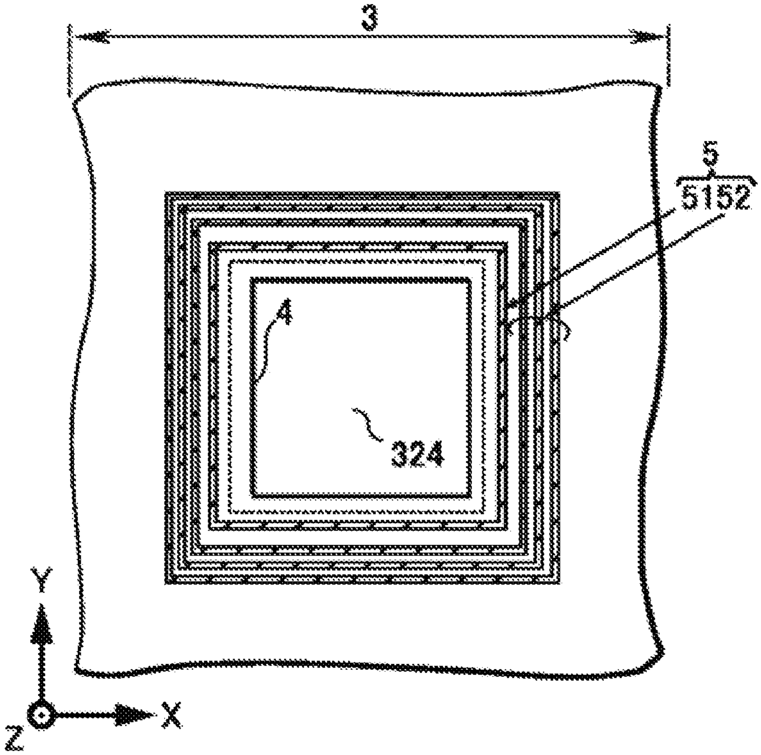
FIG. 27 is an enlarged plan view of an external terminal and an isolator provided within the peripheral region in the solid-state imaging device illustrated in FIG. 26, which corresponds to FIG. 4.

As to a solid-state imaging device 1 according to a third embodiment, such an example will now be described that, in the solid-state imaging device 1 according to the first embodiment, the structure of the isolators 5 within the peripheral region 3 is changed. As illustrated in FIGS. 26 and 27, in the solid-state imaging device 1 according to the third embodiment, within the peripheral region 3, the first isolator 51 in the isolator 5 is provided, centered around the opening 4, at a position inside a position at which the second isolator 52 is provided. Excluding this configuration, the solid-state imaging device 1 according to the third embodiment has the same configuration as the solid-state imaging device 1 according to the first embodiment.

With the solid-state imaging device 1 configured as described above, it is possible to achieve workings and effects similar to the workings and effects achieved with the solid-state imaging device 1 according to the first embodiment. Furthermore, in the solid-state imaging device 1, the first isolator 51 is provided, centered around the opening 4, at the position inside the position at which the second isolator 52 is provided. Accordingly, it is possible to enhance insulation performance of the first isolator 51 at a position close to the inner wall of the opening 4, and it is possible to enhance mechanical strength of the first semiconductor layer 110.

4. Fourth Embodiment

Figure 28:
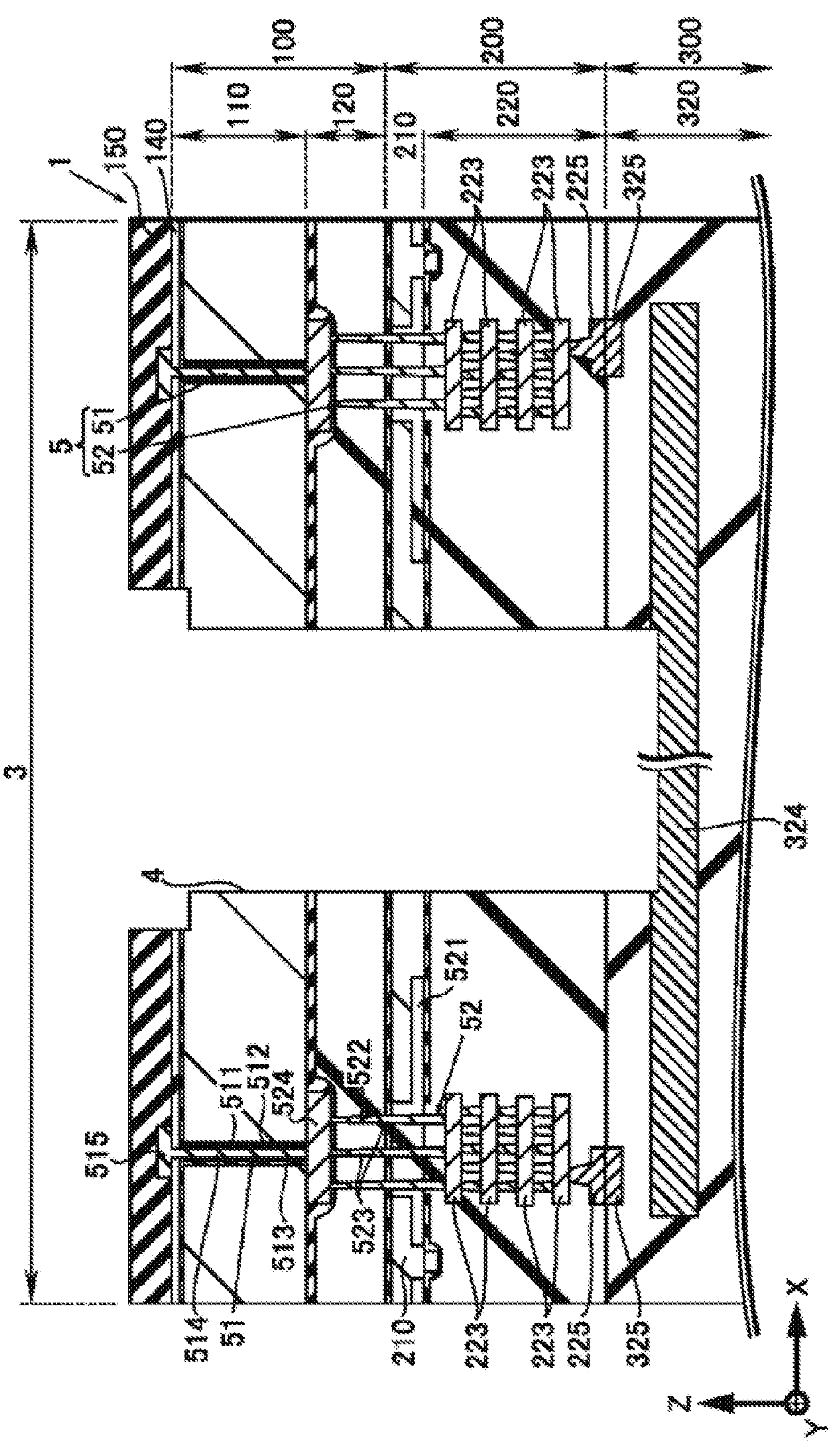
FIG. 28 is a longitudinal cross-sectional configuration diagram of a peripheral region in a solid-state imaging device according to a fourth embodiment of the present disclosure, which corresponds to FIG. 4.
Figure 29:
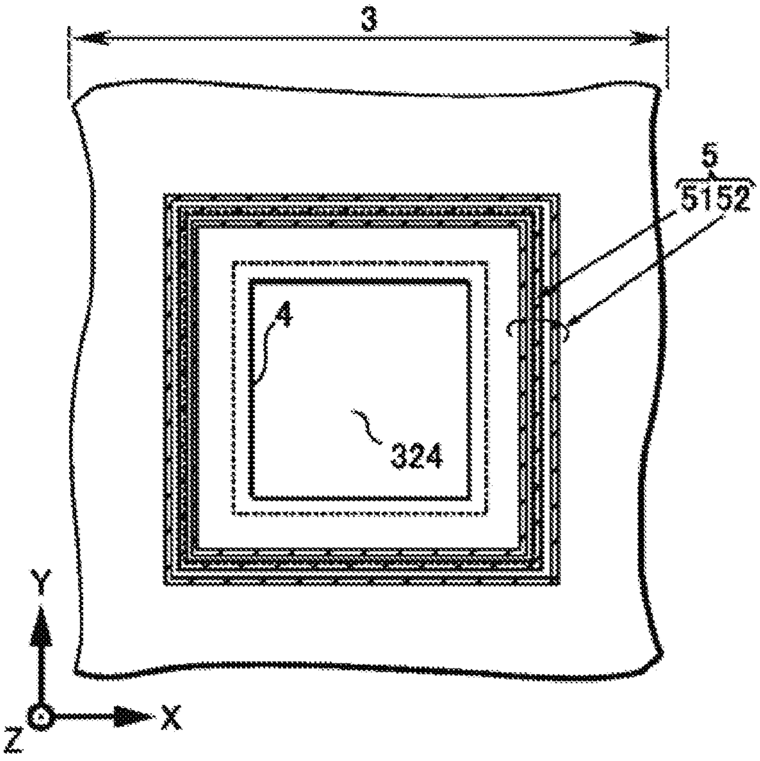
FIG. 29 is an enlarged plan view of an external terminal and an isolator provided within the peripheral region in the solid-state imaging device illustrated in FIG. 28, which corresponds to FIG. 4.

As to a solid-state imaging device 1 according to a fourth embodiment, such an example will now be described that, in the solid-state imaging device 1 according to the first embodiment, the structure of the isolator 5 within the peripheral region 3 is changed. As illustrated in FIGS. 28 and 29, in the solid-state imaging device 1 according to the fourth embodiment, within the peripheral region 3, the first isolator 51 in the isolator 5 is provided, centered around the opening 4, at the same position as the position at which the second isolator 52 is provided. Excluding this configuration, the solid-state imaging device 1 according to the fourth embodiment has the same configuration as the solid-state imaging device 1 according to the first embodiment.

With the solid-state imaging device 1 configured as described above, it is possible to achieve workings and effects similar to the workings and effects achieved with the solid-state imaging device 1 according to the first embodiment. Furthermore, in the solid-state imaging device 1, the first isolator 51 is respectively provided, centered around the opening 4, at the same position as the position at which the second isolator 52 is provided. Accordingly, it is possible to enhance insulation performance of the first isolator 51 and the second isolator 52, and it is possible to enhance mechanical strength of the first semiconductor layer 110 and the second semiconductor layer 210.

5. Fifth Embodiment

As to a solid-state imaging device 1 according to a fifth embodiment, such an example will now be described that, in the solid-state imaging device 1 according to the first embodiment, the structure of the second isolator 52 in the isolator 5 within the peripheral region 3 is changed.

Figure 30:
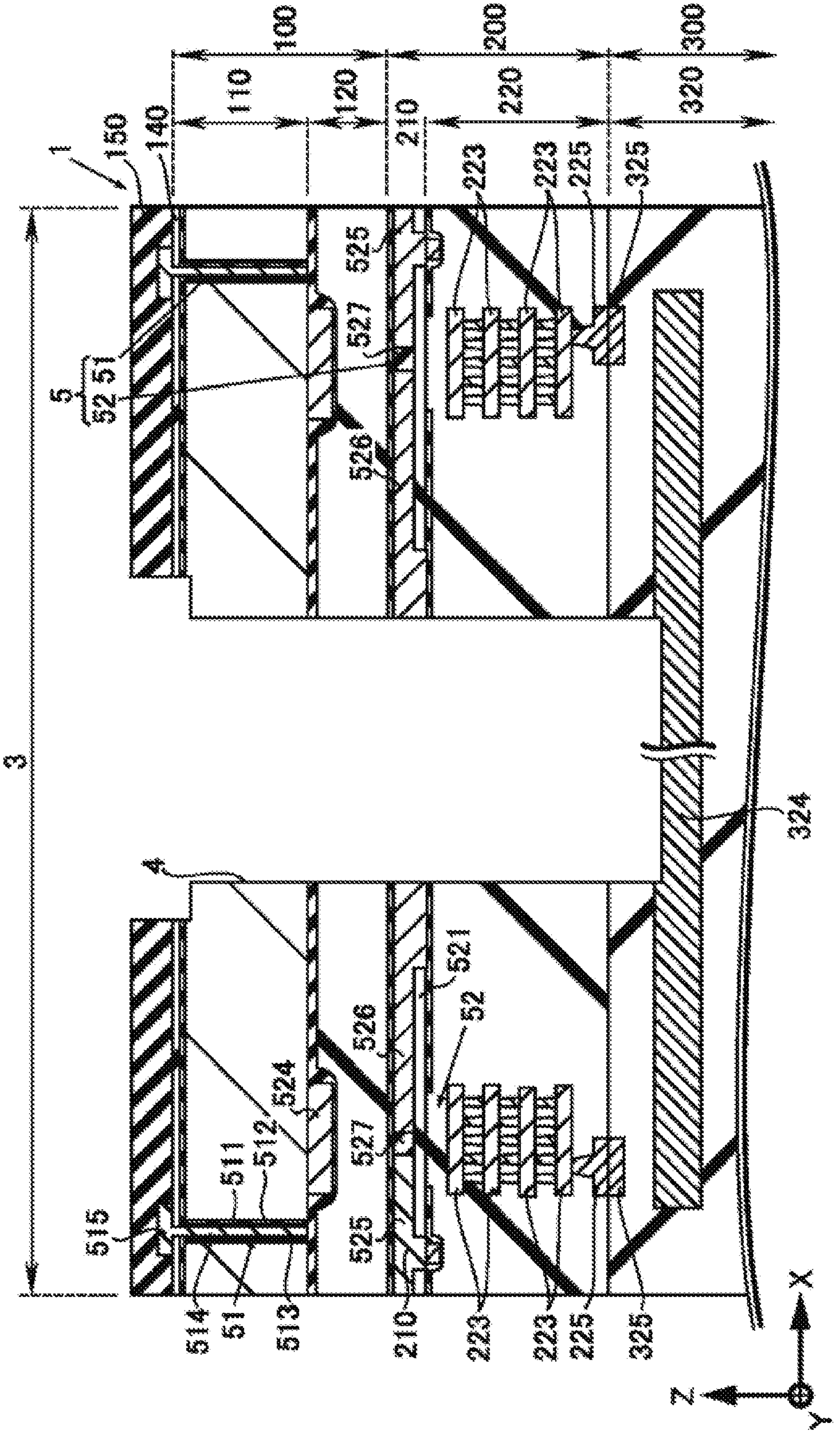
FIG. 30 is a longitudinal cross-sectional configuration diagram of a peripheral region in a solid-state imaging device according to a fifth embodiment of the present disclosure, which corresponds to FIG. 4.
Figure 31:
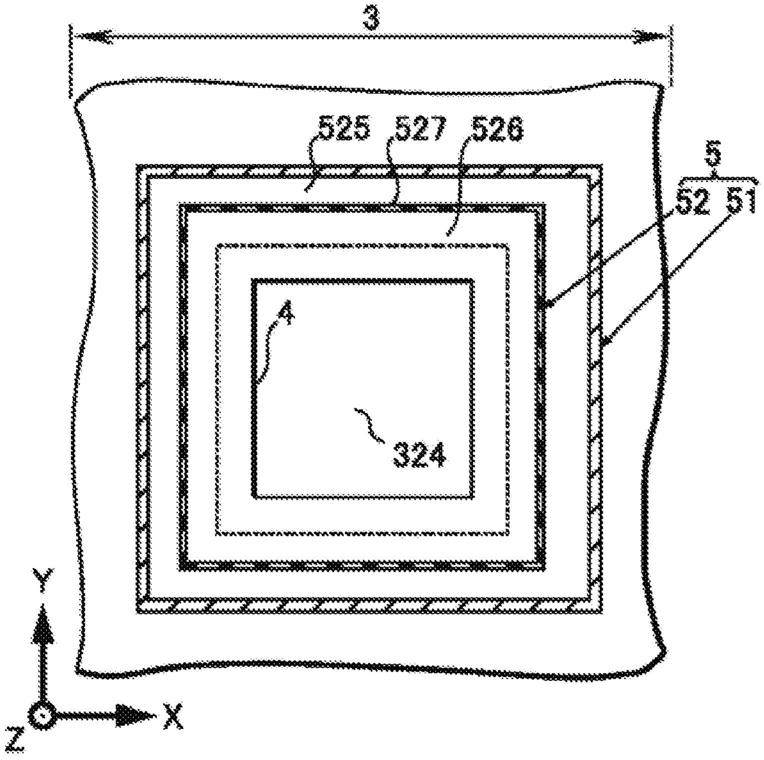
FIG. 31 is an enlarged plan view of an external terminal and an isolator provided within the peripheral region in the solid-state imaging device illustrated in FIG. 30, which corresponds to FIG. 4.

As illustrated in FIGS. 30 and 31, in the solid-state imaging device 1 according to the fifth embodiment, within the peripheral region 3, the second isolator 52 includes a first semiconductor region 525, a second semiconductor region 526, and a element isolator 527. The first semiconductor region 525 is provided in the second semiconductor layer 210 at a position that correspond to the first isolator 51. The first semiconductor region 525 is a p-type semiconductor region, for example. The first semiconductor region 525 is configured with the same structure as the p-type semiconductor region 213 provided within the pixel region 2 (see FIG. 3), and is formed through the same manufacturing steps. The second semiconductor region 526 is provided closer to the opening 4 than the first semiconductor region 525 in the second semiconductor layer 210. The second semiconductor region 526 is an n-type semiconductor regions, for example. In a case where an n-type semiconductor region that corresponds to a well region is provided within the pixel region 2 or the peripheral region 3, the second semiconductor region 526 is configured with the same structure as the n-type semiconductor region that correspond to the well region, and is formed through the same manufacturing steps. In a case where the n-type semiconductor region that corresponds to the well region is not provided, another step is added to form the second semiconductor region 526. The element isolator 527 is provided between the first semiconductor region 525 and the second semiconductor region 526. The element isolator 527 is configured with the same structure as the element isolator 214 provided within the pixel region 2, and is formed through the same manufacturing steps.

With the solid-state imaging device 1 configured as described above, it is possible to achieve workings and effects similar to the workings and effects achieved with the solid-state imaging device 1 according to the first embodiment. Furthermore, in the solid-state imaging device 1 according to the fifth embodiment, the first semiconductor region 525 and the second semiconductor region 526 in the second isolator 52 may be formed as n-type semiconductor regions, and the element isolator 527 may be formed as a p-type semiconductor region. In this case, an n-p-n isolation structure is formed in the second isolator 52.

6. Sixth Embodiment

As to solid-state imaging devices 1 according to a sixth embodiment and a seventh embodiment, such examples will now be described that, in the solid-state imaging device 1 according to the first embodiment, the structure of the external terminal 324 is changed.

Figure 32:
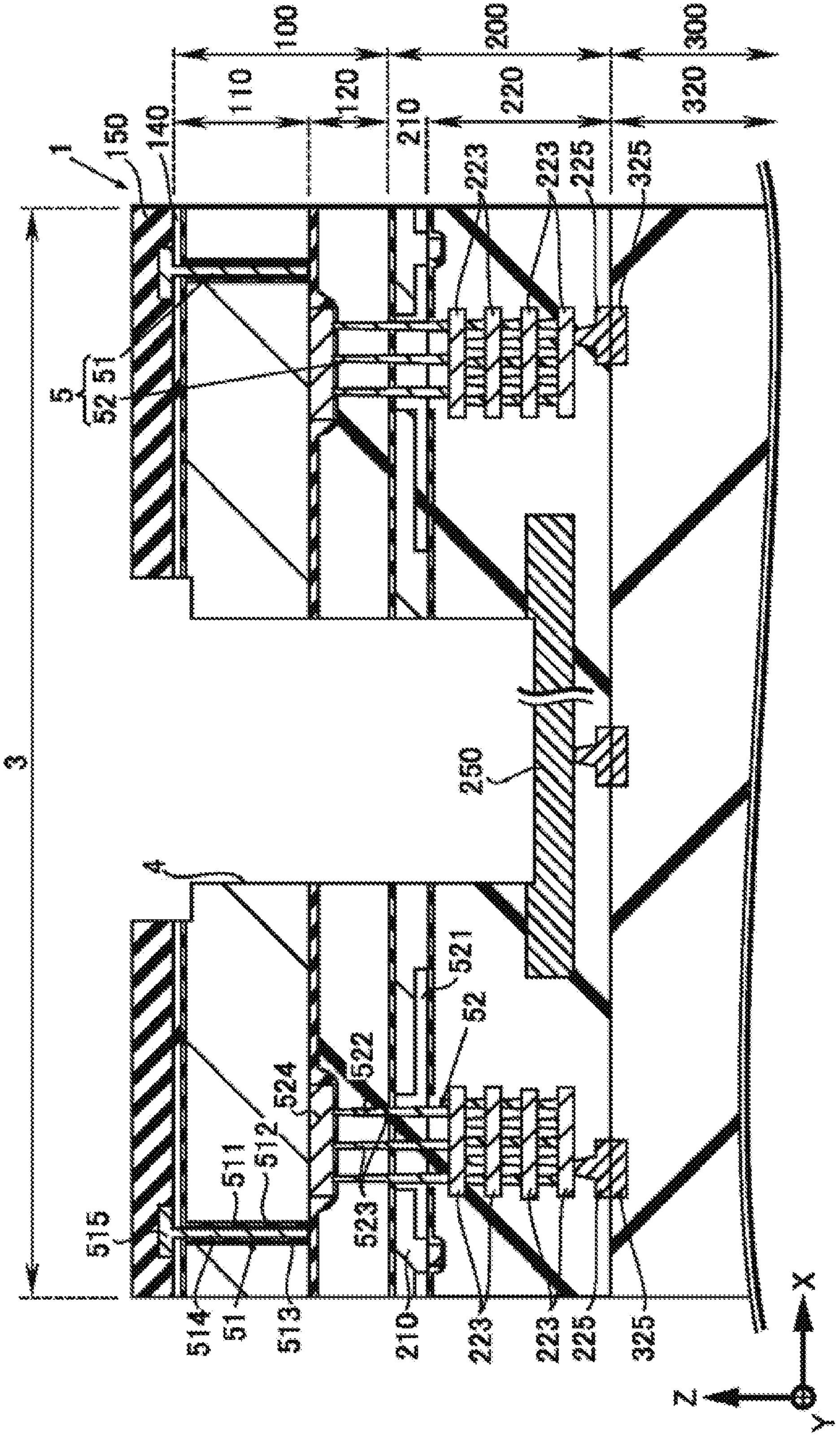
FIG. 32 is a longitudinal cross-sectional configuration diagram of a peripheral region in a solid-state imaging device according to a sixth embodiment of the present disclosure, which corresponds to FIG. 4.

As illustrated in FIG. 32, in the solid-state imaging device 1 according to the sixth embodiment, an external terminal 250 is provided within the peripheral region 3. The external terminal 250 is formed in the second wiring layer 220 in the second base body 200. The opening 4 is formed from the peripheral region 3 in the first semiconductor layer 110 to a surface of the external terminal 250 through the second semiconductor layer 210. Furthermore, the external terminal 250 are coupled to the terminal 225, and the terminal 225 is joined to the terminal 325 in the third base body 300.

With the solid-state imaging device 1 configured as described above, it is possible to achieve workings and effects similar to the workings and effects achieved with the solid-state imaging device 1 according to the first embodiment.

7. Seventh Embodiment

Figure 33:
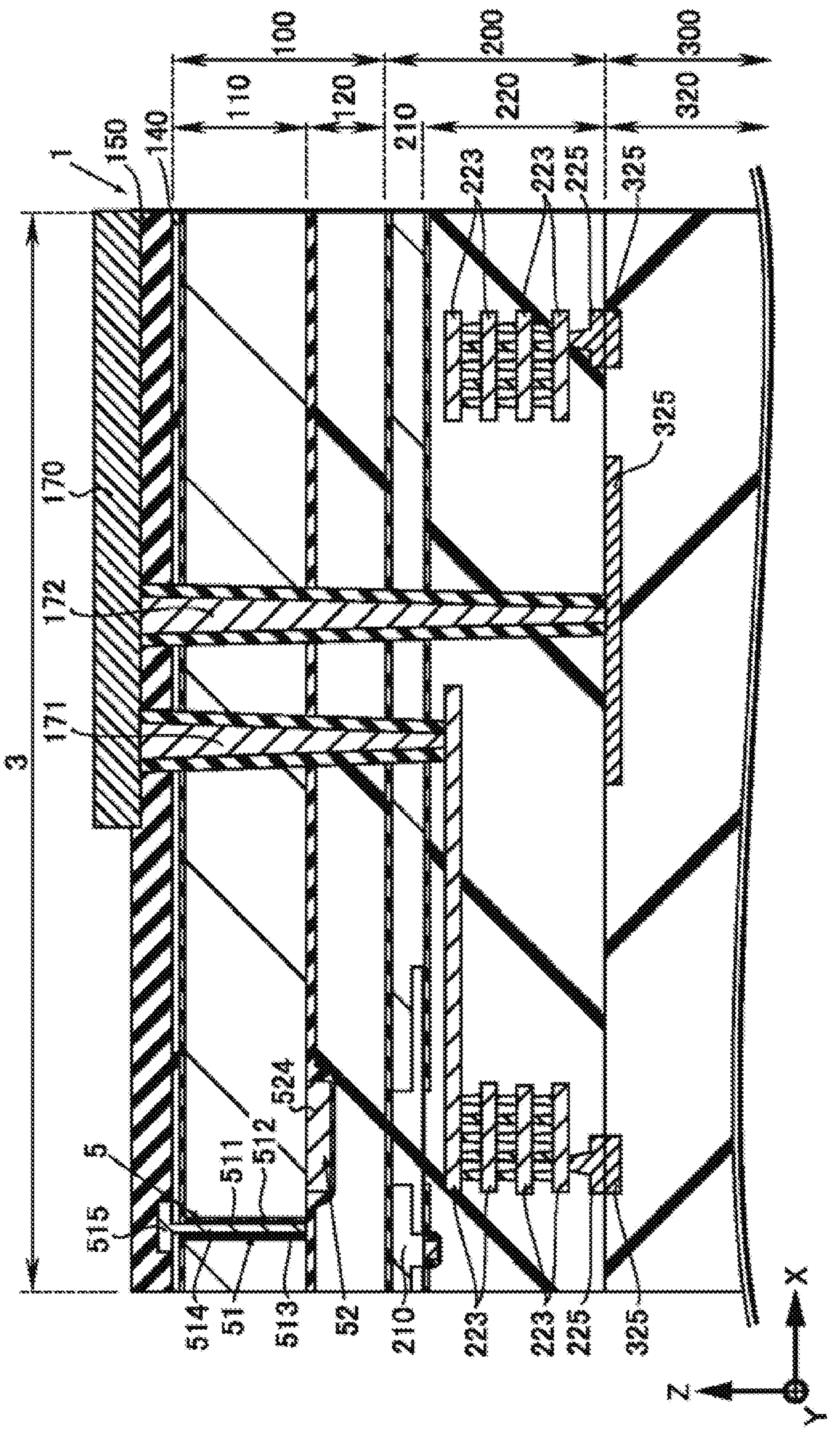
FIG. 33 is a longitudinal cross-sectional configuration diagram of a peripheral region in a solid-state imaging device according to a seventh embodiment of the present disclosure, which corresponds to FIG. 4.

As illustrated in FIG. 33, in the solid-state imaging device 1 according to the seventh embodiment, an external terminal 170 is provided within the peripheral region 3. The external terminal 170 is provided on the light incident side of the first base body 100. The external terminal 170 is coupled, via a through wire 171, to the wires 223 in the second wiring layer 220 in the second base body 200. Furthermore, the external terminal 170 is coupled, via a through wires 172, to the terminal 325 in the third base body 300. Depending on an application, one of the through wire 171 and the through wire 172 may be provided. In the solid-state imaging device 1 according to the seventh embodiment, the opening 4 is not provided. However, the isolator 5 including the first isolator 51 and the second isolator 52 is provided within the peripheral region 3.

With the solid-state imaging device 1 configured as described above, it is possible to achieve workings and effects similar to the workings and effects achieved with the solid-state imaging device 1 according to the first embodiment.

8. Application Example to Mobile Body

The technology according to the present disclosure (the present technology) is applicable to various products. For example, the technology according to the present disclosure may be implemented as a device to be mounted on any type of mobile body such as an automobile, an electric vehicle, a hybrid electric vehicle, a motorcycle, a bicycle, a personal mobility, an airplane, a drone, a vessel, or a robot.

Figure 34:
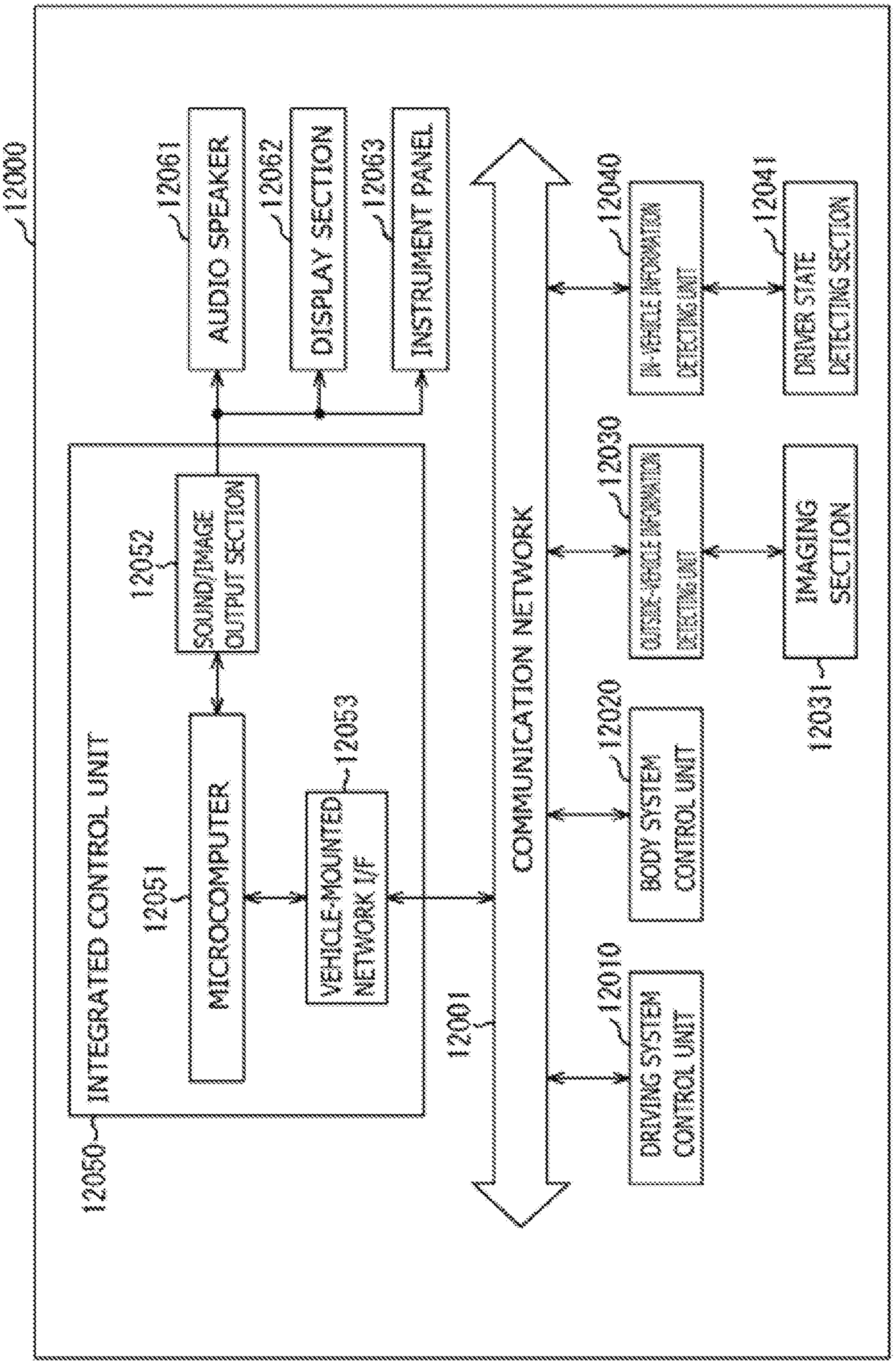
FIG. 34 is a block diagram depicting an example of schematic configuration of a vehicle control system.

FIG. 34 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 34, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 34, an audio speaker 12061, a display section 12062, and an instrument panel 12063 are illustrated as the output device. The display section 12062 may, for example, include at least one of an on-board display and a head-up display.

Figure 35:
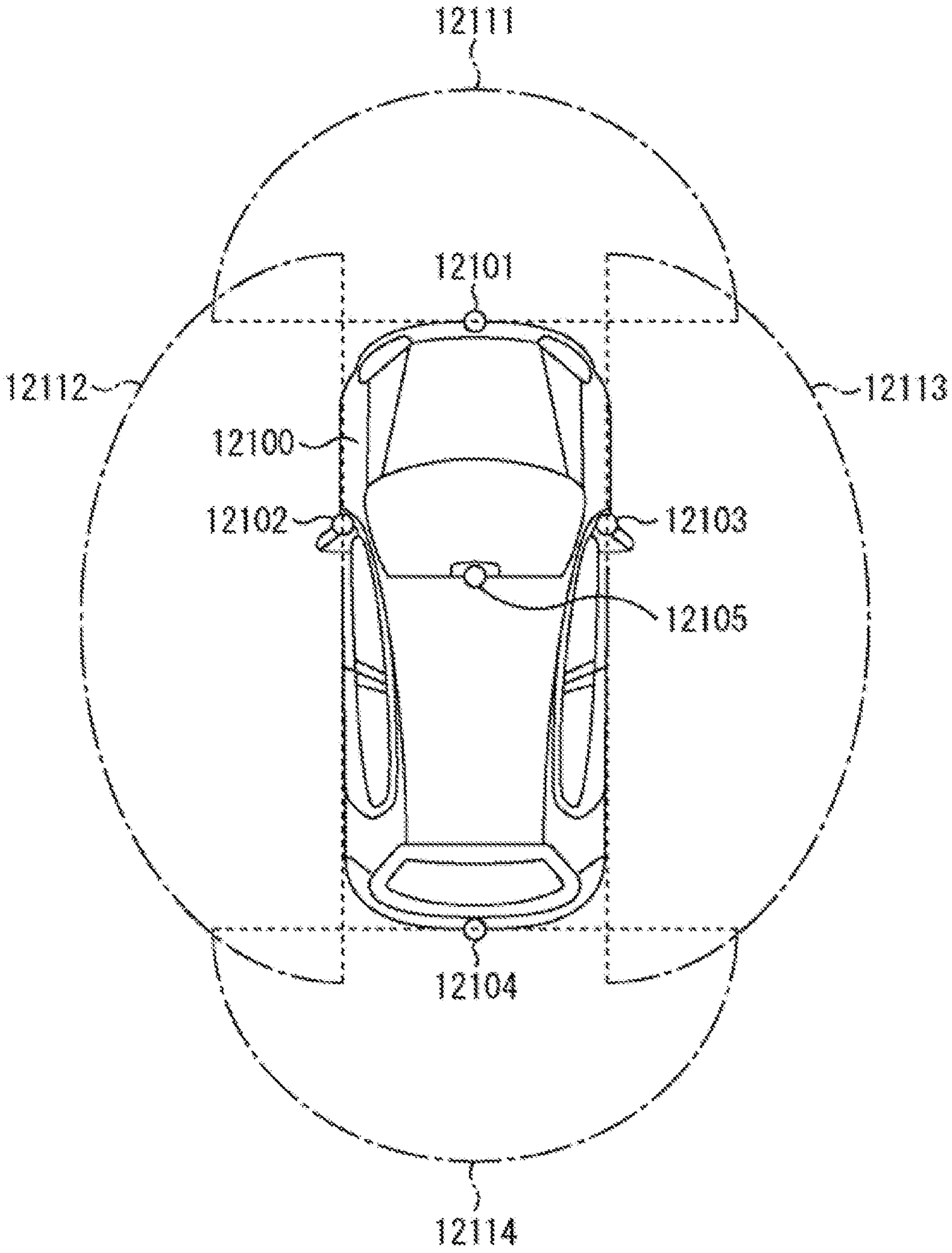
FIG. 35 is a diagram of assistance in explaining an example of installation positions of an outside-vehicle information detecting section and an imaging section.

FIG. 35 is a diagram depicting an example of the installation position of the imaging section 12031.

In FIG. 35, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 35 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure may be applied to, for example, the imaging section 12031 among the configurations described above. Applying the technology according to the present disclosure to the imaging section 12031 makes it possible to implement the imaging section 12031 with a simpler configuration.

9. 9. Application Example to Endoscopic Surgery System

The technology according to the present disclosure (present technology) is applicable to various products. For example, the technology according to the present disclosure may be applied to an endoscopic surgery system.

Figure 36:
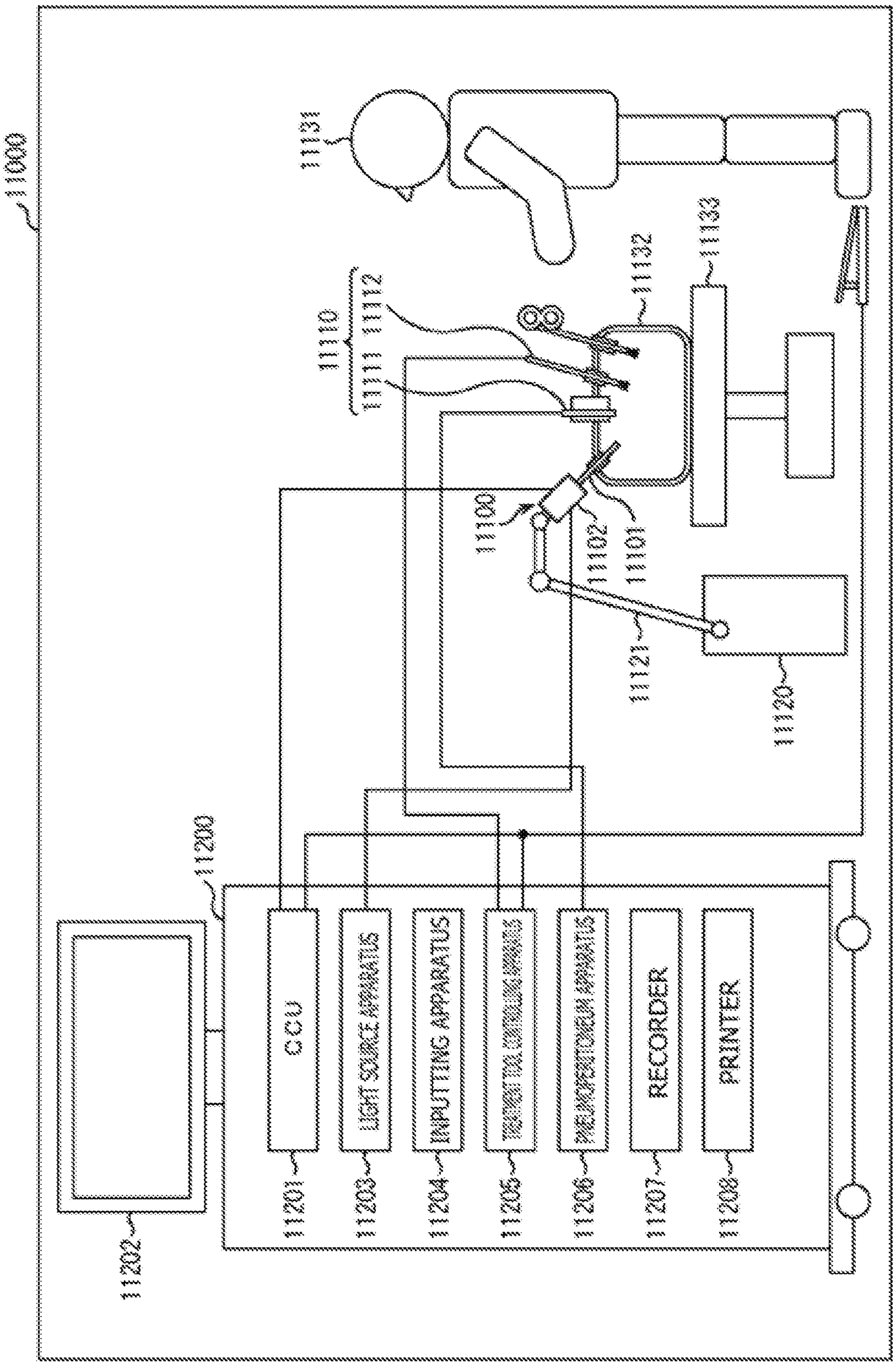
FIG. 36 is a view depicting an example of a schematic configuration of an endoscopic surgery system.

FIG. 36 is a view depicting an example of a schematic configuration of an endoscopic surgery system to which the technology according to an embodiment of the present disclosure (present technology) can be applied.

In FIG. 36, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 37:
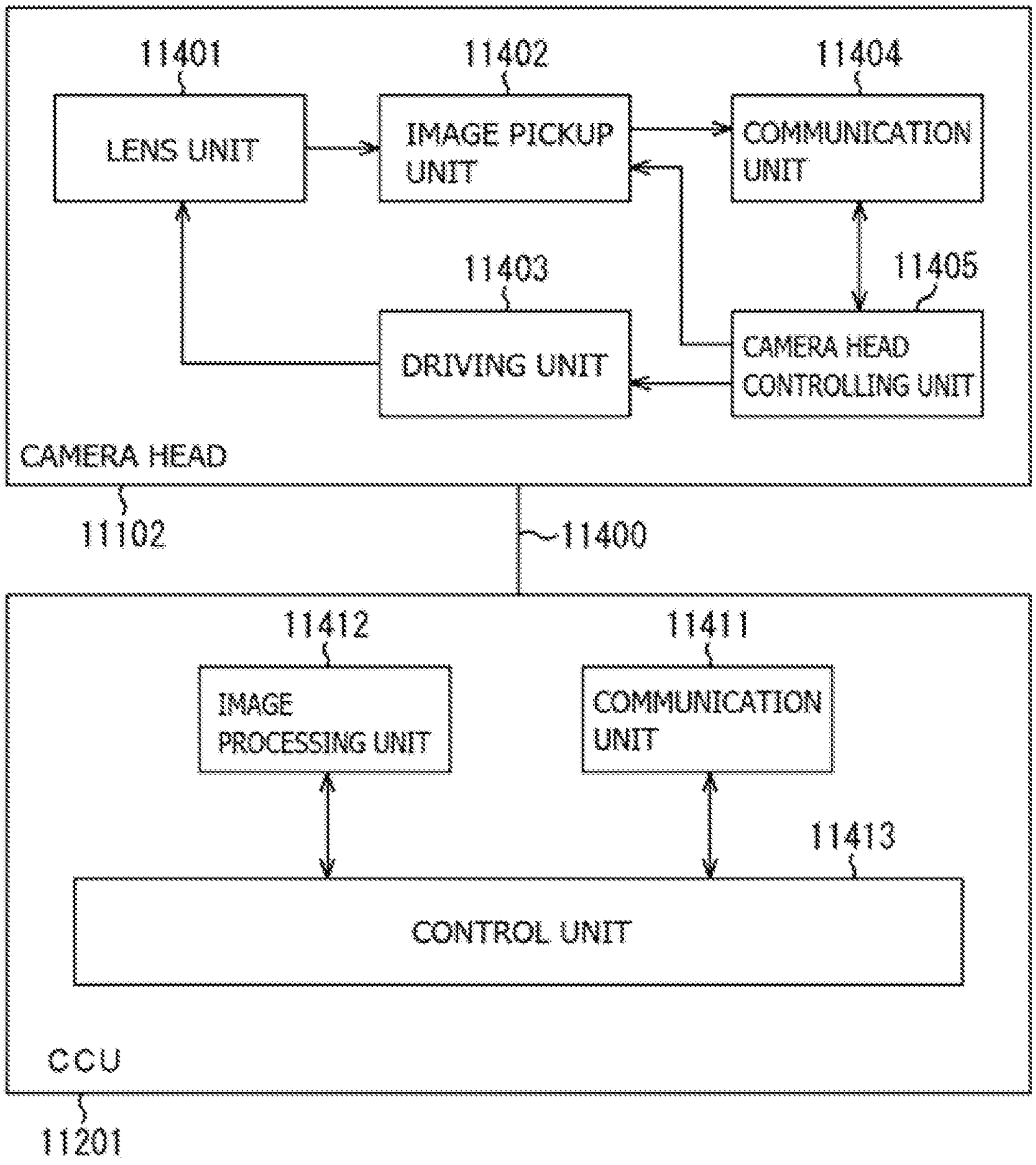
FIG. 37 is a block diagram depicting an example of a functional configuration of a camera head and a camera control unit (CCU).

FIG. 37 is a block diagram depicting an example of a functional configuration of the camera head 11102 and the CCU 11201 depicted in FIG. 36.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure may be applied has been described above. The technology according to the present disclosure may be applied to, for example, the image pickup unit 11402 of the camera head 11102 among the configurations described above. Applying the technology according to the present disclosure to the image pickup unit 11402 makes it possible to achieve a simplified structure and obtain a favorable image of the surgical region.

Note that the endoscopic surgery system has been described here as an example, but the technology according to the present disclosure may be additionally applied to, for example, a microscopic surgery system and the like.

10. Other Embodiments

The present technology is not limited to the embodiments described above. It is possible to modify the embodiments in a variety of ways without departing from the spirit of the present technology. For example, within a peripheral region in a solid-state imaging device, a first isolator in an isolator may include a trench and an insulating body buried in the trench. In this case, the insulating body may include silicon oxide or silicon nitride, or a combination of silicon oxide and silicon nitride. Furthermore, the insulating body may be silicon oxide or silicon nitride formed around metal or polycrystalline silicon. In this case, the metal or the polycrystalline silicon buried in the insulating body may be in an electrically floating state or in a state of coupling to a fixed potential, such as a ground. Furthermore, an insulating body in a second isolator in an isolator may include silicon nitride, a low dielectric constant material, air, or the like. The present technology is applied to a solid-state imaging device that includes, on a third base body, two layers, i.e., a first semiconductor layer and a second semiconductor layer. However, the present technology is applicable to a semiconductor layer that includes, on a third base body, three or more layers.

According to the present disclosure, it is possible to provide a solid-state imaging device that makes it possible to easily achieve a structure of an insulating structure body provided around an external terminal, and a method of manufacturing a solid-state imaging device that makes it possible to reduce the number of steps in manufacturing an insulating structure body.

Configuration of Present Technology

The present technology has the following configurations.

(1)

A solid-state imaging device includes:

a first semiconductor layer having a pixel region and a peripheral region, the pixel region in which a plurality of pixels is arranged, and the peripheral region provided around the pixel region;

a second semiconductor layer stacked on the first semiconductor layer on side opposite to light incident side of the pixels, the second semiconductor layer being provided with a pixel circuit coupled to the pixels;

an external terminal provided in an opening that communicates with the second semiconductor layer from the peripheral region in the first semiconductor layer;

a first isolator provided in the first semiconductor layer within the peripheral region, the first isolator surrounding at least a portion of an outer periphery of the opening; and a second isolator provided in the second semiconductor layer within a region corresponding to the peripheral region, the second isolator surrounding at least a portion of the outer periphery of the opening.

(2)

The solid-state imaging device according to (1), in which the first isolator surrounds the whole outer periphery of the opening.

(3)

The solid-state imaging device according to (1) or (2), in which the second isolator surrounds the whole outer periphery of the opening.

(4)

The solid-state imaging device according to any one of (1) to (3), in which the first isolator is provided, centered around the opening, at a position outside a position at which the second isolator is provided.

(5)

The solid-state imaging device according to any one of (1) to (3), in which the first isolator is provided, centered around the opening, at a same position as a position at which the second isolator is provided.

(6)

The solid-state imaging device according to any one of (1) to (3), in which the first isolator is provided, centered around the opening, at a position inside a position at which the second isolator is provided.

(7)

The solid-state imaging device according to any one of (1) to (6), in which the first isolator includes a first trench formed in a thickness direction from the light incident side of the first semiconductor layer, and an insulating body formed in the first trench.

(8)

The solid-state imaging device according to (7), in which the insulating body is formed to include a plurality of layers.

(9)

The solid-state imaging device according to (8), in which the first isolator includes a first trench formed in the thickness direction from the light incident side of the first semiconductor layer, an insulating body formed in the first trench, and metal or polycrystalline silicon buried in the insulating body.

(10)

The solid-state imaging device according to (7), in which the first trench penetrates through the first semiconductor layer.

(11)

The solid-state imaging device according to any one of (1) to (10), in which the second isolator includes a second trench formed in a thickness direction from the light incident side of the second semiconductor layer, and an insulating body formed in the second trench.

(12)

The solid-state imaging device according to claim 11, in which the second trench penetrates through the second semiconductor layer.

(13)

The solid-state imaging device according to (11), in which the second trench is formed to penetrate through the insulating body, and an electrically-conductive body is formed in the second trench.

(14)

The solid-state imaging device according to (13), in which the electrically-conductive body is electrically isolated from the first semiconductor layer.

(15)

The solid-state imaging device according to (13) or (14), further including a through wire within the pixel region, the through wire penetrating through the second semiconductor layer in the thickness direction, in which the electrically-conductive layer is configured with a same structure as a structure of the through wire.

(16)

The solid-state imaging device according to any one of (1) to (15), further including a pixel isolator provided around the pixels within the pixel region in the first semiconductor layer, in which the first isolator is configured with a same structure as a structure of the pixel isolator.

(17)

The solid-state imaging device according to (16), in which the pixel isolator isolates the plurality of pixels from each other.

(18) The solid-state imaging device according to any one of (1) to (17), further including a circuit isolator in the pixel circuit in the second semiconductor layer, the circuit isolator penetrating through the second semiconductor layer in a thickness direction, in which the second isolator is configured with a same structure as a structure of the circuit isolator.

(19)

A method of manufacturing a solid-state imaging device, the method including:

forming a pixel isolator in a pixel region of a first semiconductor layer, and forming a first isolator, the pixel isolator that isolates a plurality of pixels from each other, and the first isolator that surrounds at least a portion of an outer periphery of an opening that communicates with an external terminal provided within a peripheral region around the pixel region;

forming a second semiconductor layer on the first semiconductor layer on side opposite to light incident side of the pixels, the second semiconductor layer being provided with a pixel circuit coupled to the pixels; and forming a circuit isolator in the pixel circuit, and forming a second isolator in the second semiconductor layer within the peripheral region, the circuit isolator penetrating through the second semiconductor layer in a thickness direction, and the second isolator surrounding at least a portion of the outer periphery of the opening.

This application claims the priority on the basis of Japanese Patent Application No. 2021-051844 filed on Mar. 25, 2021 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device, comprising:

a first semiconductor layer having a pixel region and a peripheral region, the pixel region in which a plurality of pixels is arranged, and the peripheral region provided around the pixel region;

a second semiconductor layer stacked on the first semiconductor layer on side opposite to light incident side of the pixels, the second semiconductor layer being provided with a pixel circuit coupled to the pixels;

an external terminal provided in an opening that communicates with the second semiconductor layer from the peripheral region in the first semiconductor layer;

a first isolator provided in the first semiconductor layer within the peripheral region, the first isolator surrounding at least a portion of an outer periphery of the opening; and a second isolator provided in the second semiconductor layer within a region corresponding to the peripheral region, the second isolator surrounding at least a portion of the outer periphery of the opening.

2. The solid-state imaging device according to claim 1, wherein the first isolator surrounds the whole outer periphery of the opening.

3. The solid-state imaging device according to claim 1, wherein the second isolator surrounds the whole outer periphery of the opening.

4. The solid-state imaging device according to claim 1, wherein the first isolator is provided, centered around the opening, at a position outside a position at which the second isolator is provided.

5. The solid-state imaging device according to claim 1, wherein the first isolator is provided, centered around the opening, at a same position as a position at which the second isolator is provided.

6. The solid-state imaging device according to claim 1, wherein the first isolator is provided, centered around the opening, at a position inside a position at which the second isolator is provided.

7. The solid-state imaging device according to claim 1, wherein the first isolator includes a first trench formed in a thickness direction from the light incident side of the first semiconductor layer, and an insulating body formed in the first trench.

8. The solid-state imaging device according to claim 7, wherein the insulating body is formed to include a plurality of layers.

9. The solid-state imaging device according to claim 8, wherein the first isolator includes a first trench formed in the thickness direction from the light incident side of the first semiconductor layer, an insulating body formed in the first trench, and metal or polycrystalline silicon buried in the insulating body.

10. The solid-state imaging device according to claim 7, wherein the first trench penetrates through the first semiconductor layer.

11. The solid-state imaging device according to claim 1, wherein the second isolator includes a second trench formed in a thickness direction from the light incident side of the second semiconductor layer, and an insulating body formed in the second trench.

12. The solid-state imaging device according to claim 11, wherein the second trench penetrates through the second semiconductor layer.

13. The solid-state imaging device according to claim 11, wherein the second trench is formed to penetrate through the insulating body, and an electrically-conductive body is formed in the second trench.

14. The solid-state imaging device according to claim 13, wherein the electrically-conductive body is electrically isolated from the first semiconductor layer.

15. The solid-state imaging device according to claim 13, further comprising a through wire within the pixel region, the through wire penetrating through the second semiconductor layer in the thickness direction, wherein the electrically-conductive layer is configured with a same structure as a structure of the through wire.

16. The solid-state imaging device according to claim 1, further comprising a pixel isolator provided around the pixels within the pixel region in the first semiconductor layer, wherein the first isolator is configured with a same structure as a structure of the pixel isolator.

17. The solid-state imaging device according to claim 16, wherein the pixel isolator isolates the plurality of pixels from each other.

18. The solid-state imaging device according to claim 1, further comprising a circuit isolator in the pixel circuit in the second semiconductor layer, the circuit isolator penetrating through the second semiconductor layer in a thickness direction, wherein the second isolator is configured with a same structure as a structure of the circuit isolator.

* * * * *